(12) United States Patent
Ji

(10) Patent No.: US 11,705,336 B2
(45) Date of Patent: *Jul. 18, 2023

(54) METHOD FOR FABRICATING A SEMICONDUCTOR DEVICE

(71) Applicant: SK hynix Inc., Gyeonggi-do (KR)

(72) Inventor: Yunhyuck Ji, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/682,643

(22) Filed: Feb. 28, 2022

(65) Prior Publication Data

US 2022/0270881 A1    Aug. 25, 2022

Related U.S. Application Data

(63) Continuation of application No. 16/878,881, filed on May 20, 2020, now Pat. No. 11,289,335.

(51) Int. Cl.
  *H01L 21/28*     (2006.01)
  *H01L 21/8234*   (2006.01)
  *H01L 21/8238*   (2006.01)

(52) U.S. Cl.
  CPC .......... *H01L 21/28229* (2013.01); *H01L 21/823437* (2013.01); *H01L 21/823462* (2013.01); *H01L 21/823857* (2013.01)

(58) Field of Classification Search
  CPC ....... H01L 21/28229; H01L 21/823437; H01L 21/823462; H01L 21/823857
  See application file for complete search history.

(56) References Cited

U.S. PATENT DOCUMENTS 11,289,335 B2 *    3/2022    Ji ................... H01L 21/28185

* cited by examiner

*Primary Examiner* — Jose R Diaz
(74) *Attorney, Agent, or Firm* — IP & T Group LLP

(57) ABSTRACT

A method for fabricating a semiconductor device includes forming a deposition-type interface layer over a substrate, converting the deposition-type interface layer into an oxidation-type interface layer, forming a high-k layer over the oxidation-type interface layer, forming a dipole interface on an interface between the high-k layer and the oxidation-type interface layer, forming a conductive layer over the high-k layer, and patterning the conductive layer, the high-k layer, the dipole interface, and the oxidation-type interface layer to form a gate stack over the substrate.

20 Claims, 18 Drawing Sheets

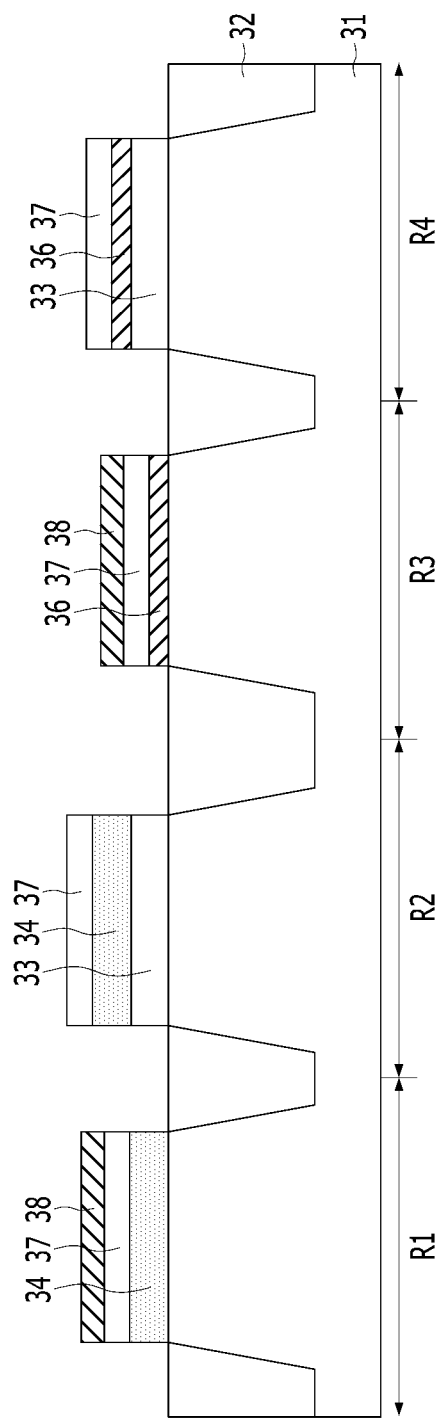

METHOD FOR FABRICATING A SEMICONDUCTOR DEVICE

CROSS-REFERENCE TO RELATED APPLICATIONS

This application is a continuation of U.S. patent application Ser. No. 16/878,881 filed on May 20, 2020 which issued as U.S. Pat. No. 11,289,335 and claims the benefits of priority of Korean Patent Application No. 10-2019-0138050, filed on Oct. 31, 2019. The disclosures of each of the foregoing applications are incorporated herein by reference in their entirety.

BACKGROUND

1. Field

Various embodiments of the present invention relate to a method for fabricating a semiconductor device, and more particularly, to a method for fabricating a semiconductor device provided with a high-k dielectric material and a metal electrode.

2. Description of the Related Art

As the integration degree of a semiconductor device increases, the amount of leakage current through a gate dielectric layer of a transistor increases. To cope with the increase in the amount of leakage current, the gate dielectric layer may be formed of a high-k dielectric material.

SUMMARY

Embodiments of the present invention are directed to a method for fabricating a semiconductor device capable of improving the reliability of a gate dielectric layer.

In accordance with an embodiment of the present invention, a method for fabricating a semiconductor device includes: forming a deposition-type interface layer over a substrate; converting the deposition-type interface layer into an oxidation-type interface layer; forming a high-k layer over the oxidation-type interface layer; forming a dipole interface on an interface between the high-k layer and the oxidation-type interface layer; forming a conductive layer over the high-k layer; and patterning the conductive layer, the high-k layer, the dipole interface, and the oxidation-type interface layer to form a gate stack over the substrate.

In accordance with another embodiment of the present invention, a method for fabricating a semiconductor device includes: preparing a substrate including a first region and a second region; forming a channel layer over the substrate of the second region; forming a deposition-type interface layer over the substrate of the first region and the channel layer; converting the deposition-type interface layer into an oxidation-type interface layer; forming a high-k layer over the oxidation-type interface layer; forming a dipole interface on an interface between the high-k layer and the oxidation-type interface layer in the first region; forming a conductive layer over the high-k layer; patterning the conductive layer, the high-k layer, the dipole interface, and the oxidation-type interface layer to form a first gate stack over the substrate of the first region; and patterning the conductive layer, the high-k layer, and the oxidation-type interface layer to form a second gate stack over the substrate of the second region.

In accordance with yet another embodiment of the present invention, a method for fabricating a semiconductor device includes: preparing a substrate including a first NMOSFET region and a second NMOSFET region; forming a thick deposition-type interface layer over the substrate of the first NMOSFET region; converting the thick deposition-type interface layer into a thick oxidation-type interface layer; forming a thin oxidation-type interface layer over the substrate of the second NMOSFET region; forming a high-k layer over the thick oxidation-type interface layer and the thin oxidation-type interface layer; forming a dipole interface on an interface between the oxidation-type interface layer and the high-k layer; forming a gate conductive layer over the high-k layer where the dipole interface is formed; and performing a gate patterning process to form a gate stack over the substrate of the first NMOSFET region and the second NMOSFET region, respectively.

In accordance with yet another embodiment of the present invention, a method for fabricating a semiconductor device, comprising: forming a silicon germanium channel layer over a substrate; depositing a silicon oxide layer over the silicon germanium channel layer; performing radical oxidation on the silicon oxide layer to form a high quality silicon oxide layer; forming a high-k layer over the high quality silicon oxide layer; forming a conductive layer over the high-k layer; and patterning the conductive layer, the high-k layer, and the high quality silicon oxide layer to form a gate stack over the substrate.

In accordance with yet another embodiment of the present invention, a method for fabricating a semiconductor device, comprising: depositing a silicon oxide layer over a substrate; performing radical oxidation on the silicon oxide layer to form a high quality silicon oxide layer; forming a high-k layer over the high quality silicon oxide layer; forming a lanthanum oxide layer the high-k layer; forming lanthanum-diffused interface between the high-k layer and the high quality silicon oxide layer; removing the lanthanum oxide layer from a surface of the high-k layer; forming a conductive layer over the surface of the high-k layer; and patterning the conductive layer, the high-k layer, and the high quality silicon oxide layer to form a gate stack over the substrate, wherein the high-k layer is directly contacted with the conductive layer without the lanthanum-diffused interface.

In accordance with yet another embodiment of the present invention, a semiconductor device comprising an N-type transistor and a P-type transistor, wherein the N-type transistor comprises: a first high quality silicon oxide layer on a semiconductor substrate; a first high-k layer on the first high quality silicon oxide layer; a first gate electrode on the first high-k layer; and a lanthanum-diffused dipole interface between the first high-k layer and the first high quality silicon oxide layer, the P-type transistor comprises: a silicon germanium layer on the semiconductor substrate; a second high quality silicon oxide layer on the silicon germanium layer; a second high-k layer on the second high quality silicon oxide layer; and a second gate electrode on the second high-k layer, wherein the second high-k layer is directly contacted with the second gate electrode without a dipole interface.

These and other features and advantages of the present invention will become apparent to those skilled in the art of the invention from the following detailed description in conjunction with the following drawings.

BRIEF DESCRIPTION OF THE DRAWINGS

FIGS. 4A to 4K are cross-sectional views illustrating a method for fabricating a semiconductor device in accordance with another embodiment of the present invention.

DETAILED DESCRIPTION

Figure 1:
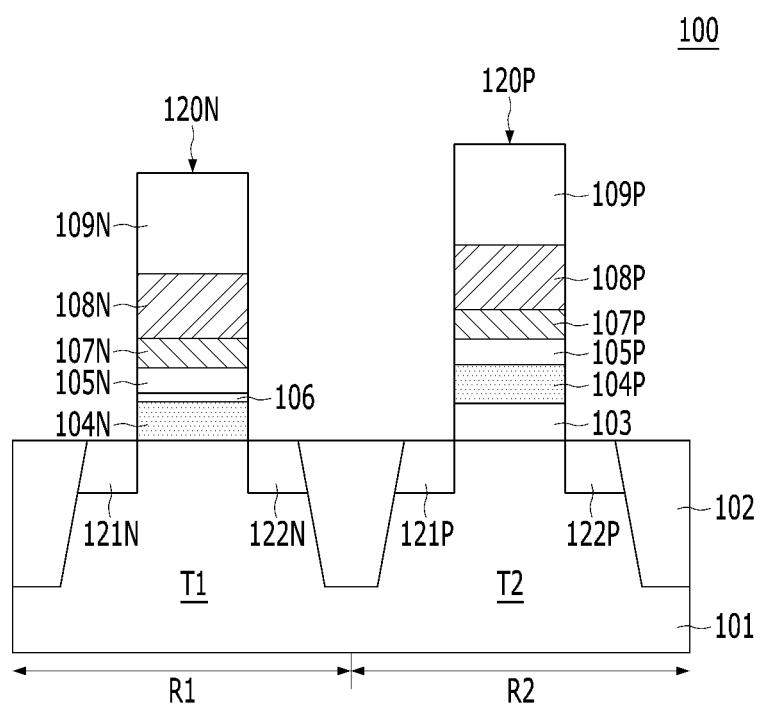
FIG. 1 is a cross-sectional view illustrating a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Hereinafter, the various embodiments of the present invention will be described in detail with reference to the attached drawings.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

CMOSFETs using a gate first process may form a gate stack including a high-k layer and a metal electrode. To modulate the threshold voltage of a CMOSFET, an NMOSFET may form a lanthanum oxide capping layer, and the PMOSFET may form a silicon-germanium (SiGe) channel layer.

A SiGe channel layer may have a germanium (Ge) concentration in the range of approximately 20 to 50 at %, and the thickness of the thick gate dielectric layer and the thin gate dielectric layer may be increased by over-oxidation, or germanium oxide (GeOx) may be formed in the process of forming a thick gate dielectric layer and a thin gate dielectric layer. As a result, the reliability of the gate dielectric layer may be deteriorated.

In order to improve the reliability, a silicon (Si) capping layer may be deposited in-situ after the SiGe channel layer is deposited, but the deposition of the Si capping layer may sharply lower the productivity. Therefore, in recent years, the increase in the thickness due to over-oxidation and the formation of germanium oxide may be suppressed by omitting the Si capping layer and depositing a deposition-type oxide as a thick gate dielectric layer. A deposition-type oxide may refer to an oxide that is deposited by an Atomic Layer Deposition (ALD) process or a Chemical Vapor Deposition (CVD) process.

However, the deposition-type oxide applied as a thick gate dielectric layer may have a deteriorated reliability because the amount of impurities and defects in the oxide are too high to cope with a radical oxide that is applied as a gate dielectric layer in the stack of silicon oxynitride (SiON) and polysilicon. Also, when the stack of silicon oxynitride (SiON) and polysilicon is applied, the amount of leakage current caused by direct tunneling of the silicon oxynitride (SiON) may increase.

Also, the lanthanum oxide capping layer may continue to be diffused into the gate dielectric layer by the post thermal treatment so as to form a trap, and the trap may deteriorate the reliability of a gate dielectric layer.

According to the following elements of the present invention, the impurities and defects in the inside of the deposition-type oxide may be removed by performing a post-process, such as radical oxidation, following the process of depositing a deposition-type oxide in order to enhance the reliability of a thick oxide.

The threshold voltage Vt of an NMOSFET may be modulated by forming a lanthanum oxide capping layer over a high-k layer and then diffusing dipole-inducing species into the interface between the high-k layer and an interface layer to form a dipole interface, and then removing the lanthanum oxide capping layer. As a result, it is possible to prevent the formation of a trap, and thus the reliability of the gate dielectric layer may be improved.

FIG. 1 is a cross-sectional view illustrating a semiconductor device 100 in accordance with an embodiment of the present invention.

Referring to FIG. 1, the semiconductor device 100 may include first and second transistors T1, T2 formed in first and second regions R1, R2, respectively. The first and second transistors T1 may be isolated by an isolation layer 102. In an embodiment, the first transistor T1 may include n-type transistor, and the second transistor T2 may include p-type transistor. For example, the first transistor T1 may be an NMOSFET, and the second transistor T2 may be a PMOSFET.

The first transistor T1 may include a first gate stack 120N formed over a substrate 101, and a first source region 121N and a first drain region 122N that are formed in the substrate 101 on both sides of the first gate stack 120N. The first gate stack 120N may include a first interface layer 104N, a first high-k layer 105N, a first metal electrode 107N, a first low resistivity electrode 108N, and a first hard mask layer 109N that are stacked in that order. The first interface layer 104N may be formed on the topmost surface of the substrate 101. The first interface layer 104N may be in direct contact with the topmost surface of the substrate 101. The first gate stack 120N may further include a dipole interface 106 between the first interface layer 104N and the first high-k layer 105N. The dipole interface 106 may include dipole-inducing species for modulating the threshold voltage of the first transistor T1. As will be described later, the dipole interface 106 may be formed on the interface between the first interface layer 104N and the first high-k layer 105N by the diffusion of the dipole-inducing species from a dielectric capping layer including the dipole-inducing species. The dipole-inducing species may include a rare earth metal of the lanthanide series. The threshold voltage of the first transistor T1 may be modulated by the dipole interface 106. The dipole interface 106 may be made of or include a rare earth metal of the lanthanide series. In an embodiment, the dipole interface 106 may be made of or include lanthanum (La). The dipole interface 106 may include a lanthanum-diffused dipole interface.

The second transistor T2 may include a second gate stack 120P formed over the substrate 101, and a second source region 121P and a second drain region 122P that are formed in the substrate 101 on both sides of the second gate stack 120P. The second gate stack 120P may include a second interface layer 104P, a second high-k layer 105P, a second metal electrode 107P, a second low resistivity electrode 108P, and a second hard mask layer 109P that are stacked in that order. The second high-k layer 105P may be directly contacted with the second metal electrode 107P without a dipole interface. The second high-k layer 105P may be directly contacted with the second interface layer 104P without a dipole interface. The second transistor T2 may further include a P channel layer 103, and the P channel layer 103 may be formed over the substrate 101 below the second gate stack 120P. The P channel layer 103 may be formed on the topmost surface of the substrate 101. The P channel layer 103 may be in direct contact with the topmost surface of the substrate 101.

The P channel layer 103 may be crystalline and may contain a large amount of germanium. The P channel layer 103 may be made of or include silicon germanium. The second metal electrode 107P may have a work function suitable for the second transistor T2.

Referring to FIG. 1, the first gate stack 120N may include the first interface layer 104N, and the second gate stack 120P may include the second interface layer 104P.

The first interface layer 104N and the second interface layer 104P may be made of the same material. For example, the first interface layer 104N and the second interface layer 104P may be made of silicon oxide. The first interface layer 104N and the second interface layer 104P may be made of silicon oxide provided by a combination of deposition and post-oxidation. For example, each of the first interface layer 104N and the second interface layer 104P may be an oxidation-type silicon oxide. The oxidation-type silicon oxide may be made of silicon oxide that is converted from the deposition-type silicon oxide. For example, the oxidation-type silicon oxide may be a material that is obtained by converting the deposition-type silicon oxide by a radical oxidation process. The deposition-type silicon oxide may be deposited by an Atomic Layer Deposition (ALD) process or a Chemical Vapor Deposition (CVD) process.

Since the deposition-type silicon oxide is converted into the oxidation-type silicon oxide, the first interface layer 104N and the second interface layer 104P may be high-quality silicon oxide ($SiO_2$) which is free or substantially free of impurities and defects. Hence, high-quality silicon oxide (HQ $SiO_2$) means that the silicon oxide may not contain impurities and defects. Furthermore, although the deposition-type silicon oxide may include large amounts of impurities and defects inside the layer, the impurities and defects may be removed as the deposition-type silicon oxide is converted into the oxidation-type silicon oxide by a radical oxidation process to produce a high-quality silicon oxide which is free or substantially free of impurities and defects.

The first and second high-k layers 105N and 105P may include high-k materials having a high-k constant. Suitable materials for the first and second high-k layers 105N and 105P may have a dielectric constant which is greater than the dielectric constant of silicon oxide ($SiO_2$) (which is approximately 3.9). Also, the first and second high-k layers 105N and 105P may be physically thicker than silicon oxide ($SiO_2$) and may have a lower equivalent oxide thickness (EOT) value. The first and second high-k layers 105N and 105P may have a dielectric constant which is greater than the dielectric constant of the first and second interface layers 104N and 104P.

The first and second high-k layers 105N and 105P may include a metal-containing material such as a metal oxide, a metal silicate, and a metal silicate nitride. The metal oxide may include an oxide containing a metal such as hafnium (Hf), aluminum (Al), lanthanum (La), zirconium (Zr), and the like. The metal oxide may be made of or include hafnium oxide, aluminum oxide, lanthanum oxide, zirconium oxide, or a combination thereof. For example, the metal oxide may be made of or include $HfO_2$, $Al_2O_3$, $La_2O_3$, $ZrO_2$ or a combination thereof. The metal silicate may include a silicate containing metal, such as hafnium (Hf) and zirconium (Zr). For example, the metal silicate may be made of or include hafnium silicate (HfSiO), zirconium silicate (ZrSiO), or a combination thereof. The metal silicate nitride may be made of or include hafnium silicate nitride (HfSiON), zirconium silicate nitride (ZrSiON), or a combination thereof.

The first and second metal electrodes 107N and 107P may be made of the same material. For example, the first and second metal electrodes 107N and 107P may be made of or include a metal nitride, such as titanium nitride.

The first and second low resistivity electrodes 108N and 108P may be made of the same material. For example, the first and second low resistivity electrodes 108N and 108P may be made of or include a tungsten-based material.

According to another embodiment of the present invention, the first metal electrode 107N may have a low work function, and the second metal electrode 107P may have a high work function. Herein, the low work function may refer to a work function which is lower than a mid-gap work function of silicon, and the high work function may refer to a work function which is higher than the mid-gap work function of silicon.

The first metal electrode 107N may include titanium-rich titanium nitride. The second metal electrode 107P may include nitrogen-rich titanium nitride.

Nitrogen-rich titanium nitride may refer to titanium nitride containing more nitrogen than the stoichiometric composition of titanium and nitrogen. Nitrogen-rich titanium nitride (N-rich TiN) is titanium containing an excessive amount of nitrogen. Titanium nitride (TiN) may have an effective work function which is different according to the composition ratio of titanium and nitrogen. For example, nitrogen-rich titanium nitride (N-rich TiN) may have a P-type effective work function, which is suitable for PMOSFETs. Nitrogen rich titanium nitride (N-rich TiN) may be formed by a Physical Vapor Deposition (PVD) process or an Atomic Layer Deposition (ALD) process.

Titanium-rich titanium nitride (Ti-rich TiN) may refer to titanium nitride with more titanium than the stoichiometric composition of titanium and nitrogen. Titanium-rich titanium nitride (Ti-rich TiN) may be titanium nitride containing an excessive amount of titanium. Titanium rich titanium nitride (Ti-rich TiN) may have an N-type effective work function which is suitable for NMOSFETs. Titanium-rich titanium nitride (Ti-rich TiN) may be formed by a Physical Vapor Deposition (PVD) process or an Atomic Layer Deposition (ALD) process.

The first and second low resistivity electrodes 108N and 108P may be made of or include a low resistivity metal, for example, tungsten. The first and second low resistivity electrodes 108N and 108P may lower the resistance of the first and second gate stacks 120N and 120P.

According to the above-described embodiment of the present invention, the first gate stack 120N may include the dipole interface 106 that is formed on the interface between the first metal electrode 107N and the first high-k layer 105N. Thus, the threshold voltage of the first transistor T1 may be modulated. That is, the threshold voltage of the first transistor T1 may be modulated by the dipole that is generated in the dipole interface 106.

Since the P channel layer 103 is formed below the second gate stack 120P, the threshold voltage of the second transistor T2 may be modulated. In other words, since the P channel layer 103 includes a large amount of germanium, an energy band gap may decrease, thereby modulating the threshold voltage into a level suitable for the P channel transistor.

As a result, the present embodiment may independently modulate the threshold voltages of the NMOSFET and the PMOSFET during the integration process of CMOSFET.

The first gate stack 120N of FIG. 1 is a gate stack of NMOSFET, and the first gate stack 120N may be a '$La_2O_3$ capping-free' gate stack from which a lanthanum oxide capping layer is omitted.

FIGS. 2A to 2I are cross-sectional views illustrating a method for fabricating a semiconductor device in accordance with an embodiment of the present invention.

Figure 2A:
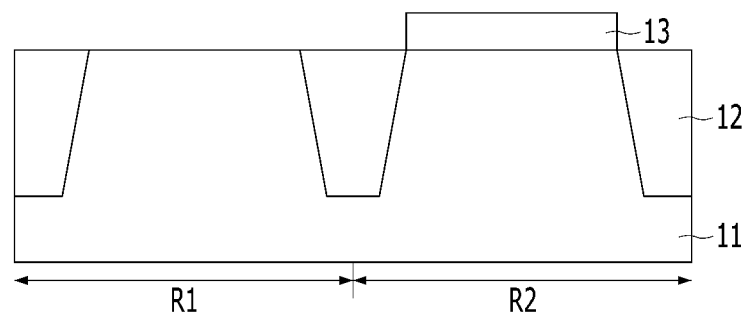
FIGS. 2A to 2I are cross-sectional views illustrating a method for fabricating a semiconductor device in accordance with an embodiment of the present invention.

Referring to FIG. 2A, a substrate 11 is prepared. The substrate 11 may include a plurality of regions where a transistor is formed. The regions may include a first region R1 and a second region R2. The substrate 11 may be made of or include a semiconductor material. The substrate 11 may include a semiconductor substrate. The substrate 11 may include a silicon substrate, a silicon germanium substrate, or an SOI substrate.

An isolation layer 12 may be formed in the substrate 11. The isolation layer 12 may be formed by a Shallow Trench Isolation (STI) process.

The first region R1 and the second region R2 may be isolated by the isolation layer 12. The first region R1 may be a region where an NMOSFET is to be formed. The second region R2 may be a region where a PMOSFET is to be formed. Although not shown, a well may be formed in the substrate 11 by a typical well forming process. A P-type well may be formed in the substrate 11 of the first region R1, and an N-type well may be formed in the substrate 11 of the second region R2.

Subsequently, a P channel layer 13 may be formed over the substrate 11 of the second region R2. The P channel layer 13 may be formed on the substrate 11 of the second region R2. The P channel layer 13 may be in direct contact with the entire top surface of the substrate 11 of the second region R2. The P channel layer 13 may be made of a crystalline material. The P channel layer 13 may be made of or include silicon germanium. The germanium concentration in a silicon germanium layer of the P channel layer 13 may range from approximately 20 at % to approximately 50 at %. The P channel layer 13 may be formed of silicon germanium only. The P channel layer 13 may be formed of crystalline silicon germanium. In an embodiment, the P channel layer 13 may be made of silicon germanium layer topped with a silicon capping layer. The P channel layer 13 may be formed by a Selective Epitaxy Growth (SEG) process. The P channel layer 13 may have a thickness of approximately 100 Å or less.

Figure 2B:
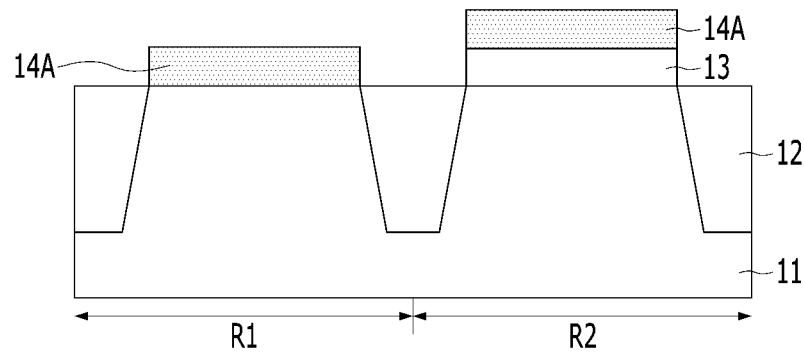

Referring to FIG. 2B, a deposition-type interface layer 14A may be formed over the substrate 11. The deposition-type interface layer 14A may be formed on the surface of the substrate 11 of the first region R1 and on the P channel layer 13 of the second region R2. The deposition-type interface layer 14A may be made of or include an oxide or oxide-based material. For example, the deposition-type interface layer 14A may be made of or include silicon oxide. The deposition-type interface layer 14A may be formed by an Atomic Layer Deposition (ALD) process or a Chemical Vapor Deposition (CVD) process. The deposition-type interface layer 14A may be formed in a thickness of approximately 10 Å or more. The deposition-type interface layer 14A may be formed to a thickness of approximately 10 Å to 70 Å.

As shown above, the deposition-type interface layer 14A may be formed by a deposition process rather than a thermal oxidation process. In other words, the deposition-type interface layer 14A may include a deposition-type oxide. The oxide formed by the thermal oxidation process may be abbreviated as an oxidation-type oxide.

The deposition-type oxide may be formed relatively thicker than a thermal oxide, but there may be a large amount of impurities in the layer. Also, the deposition-type oxide may suppress over-oxidation of the P channel layer 13.

The deposition-type interface layer 14A may be made of or include silicon oxide. The silicon oxide may be deposition-type silicon oxide. For example, the silicon oxide may be formed using an atomic layer deposition process (ALD) or a chemical vapor deposition (CVD) process. In an embodiment, the silicon oxide may be formed using an atomic layer deposition process (ALD). The deposition-type silicon oxide may be deposited using a silicon source and an oxidation source. The silicon source may include silane, disilane, dichlorosilane, diisopropylaminosilane (DIPAS), and the like, and the oxidation source may include $O_2$, $O_3$, and the like. Atomic layer deposition of silicon oxide may be performed several times in a unit cycle of silicon source injection, purge, oxidation source injection, and purge.

Figure 2C:
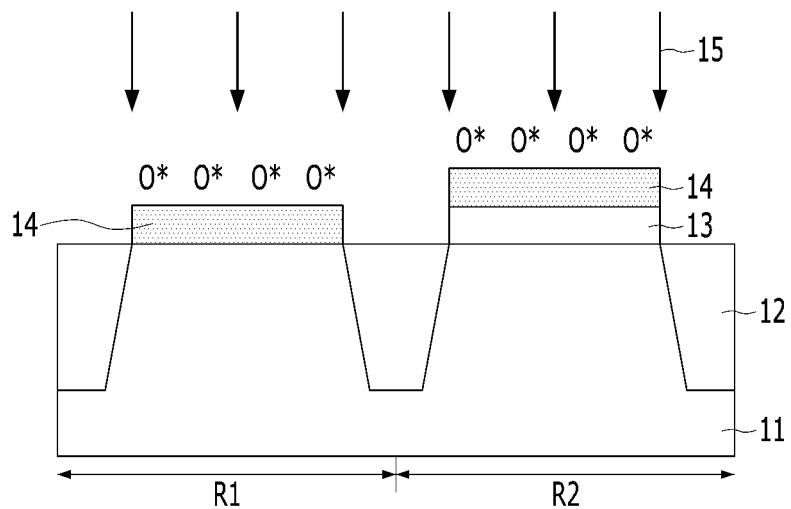

Referring to FIG. 2C, a post-process 15 may be performed. The post-process 15 may include a radical oxidation process. The radical oxidation process may be referred to as post-oxidation. The radical oxidation process may be performed using oxygen radicals (O*). The radical oxidation process may enhance the reliability of the deposition-type interface layer 14A. For example, impurities may be removed from the deposition-type interface layer 14A by the radical oxidation process. The impurities may be removed by the oxygen radicals. Therefore, the deposition-type interface layer 14A may be converted into the oxidation-type interface layer 14 as shown by the reference numeral 14.

Since the oxidation-type interface layer 14 is free of the impurities, it has an excellent film quality with low defects. When the deposition-type interface layer 14A is silicon oxide, a high-quality silicon oxide (HQ $SiO_2$) may be formed by the radical oxidation process 15. The oxidation-type interface layer 14 may be a high-quality silicon oxide.

According to another embodiment of the present invention, the post-process 15 for forming the oxidation-type interface layer 14 may include dry oxidation. Also, according to another embodiment of the present invention, after the oxidation-type interface layer 14 is formed, a process such as plasma nitridation and annealing may be further performed.

The post-process 15 may remove impurities and defects in the oxidation-type interface layer 14, thereby enhancing the reliability.

Figure 2D:
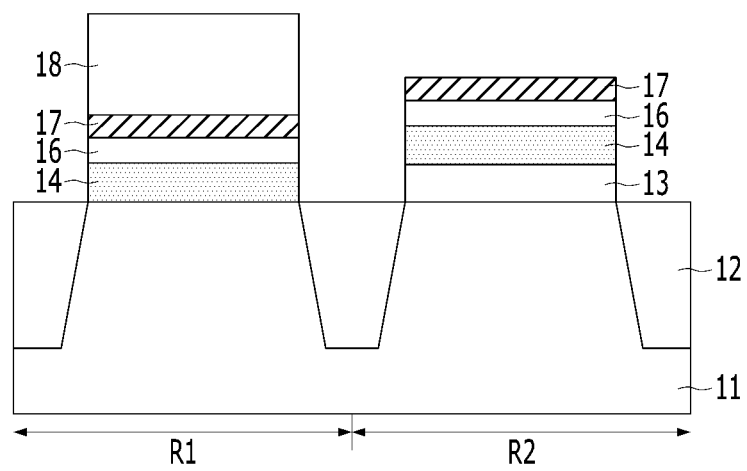

Referring to FIG. 2D, a high-k layer 16 may be formed over the oxidation-type interface layer 14. The high-k layer 16 may be formed on the oxidation-type interface layer 14. The high-k layer 16 may be in direct contact with the oxidation-type interface layer 14. The high-k layer 16 may have a high dielectric constant (High-k). The high-k layer 16 may have a dielectric constant which is greater than the dielectric constant of silicon oxide ($SiO_2$) which is approximately 3.9. Also, the high-k layer 16 may be physically thicker than silicon oxide ($SiO_2$) and may have a lower equivalent oxide thickness (EOT) value. The high-k layer 16 may have a higher dielectric constant than the oxidation-type interface layer 14. The high-k layer 16 may be made of or include a metal oxide, a metal silicate, a metal silicate nitride, or the like. The metal oxide may include an oxide containing a metal such as hafnium (Hf), aluminum (Al), lanthanum (La), zirconium (Zr), and the like. The metal oxide may be made of or include hafnium oxide, aluminum oxide, lanthanum oxide, zirconium oxide, or a combination thereof. For example, the metal oxide may be made of or include $HfO_2$, $Al_2O_3$, $La_2O_3$, $ZrO_2$ or a combination thereof. The metal silicate may include a silicate containing metal such as hafnium (Hf) and zirconium (Zr). For example, the metal silicate may be made of or include hafnium silicate (HfSiO), zirconium silicate (ZrSiO), or a combination thereof. The metal silicate nitride may be made of or include hafnium silicate nitride (HfSiON), zirconium silicate nitride (ZrSiON) or a combination thereof. In this embodiment of the present invention, the high-k layer 16 may include HfSiO, which may be formed by an Atomic Layer Deposition (ALD) process.

A dielectric capping layer 17 may be formed over the high-k layer 16. The dielectric capping layer 17 may be formed on the high-k layer 16. The dielectric capping layer 17 may be in direct contact with the high-k layer 16. The dielectric capping layer 17 may contain dipole-inducing species. The dipole-inducing species may be diffused into the space between the high-k layer 16 and the oxidation-type interface layer 14 from the subsequent process. The dielectric capping layer 17 may include lanthanum. The dielectric capping layer 17 may include lanthanum oxide ($La_2O_3$). The dielectric capping layer 17 may be formed by Atomic Layer Deposition (ALD) or Physical Vapor Deposition (PVD). The dielectric capping layer 17 may be a sacrificial layer which is removed after the post thermal treatment.

The mask pattern 18 may be formed over the dielectric capping layer 17 of the first region R1. The mask pattern 18 may be formed in the first region R1, and the second region R2 may be exposed by the mask pattern 18. The mask pattern 18 may be or include a photoresist. A portion of the dielectric capping layer 17 may be exposed by the mask pattern 18, for example, the dielectric capping layer 17 of the second region R2 may be exposed.

Figure 2E:
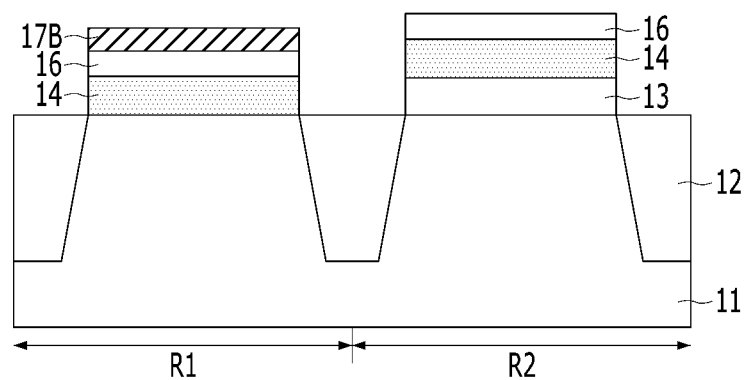

Referring to FIG. 2E, a portion of the dielectric capping layer 17 may be removed by using the mask pattern 18. For example, HCl may be used to remove a portion of the dielectric capping layer 17. The dielectric capping layer 17 may remain in the first region R1 and may be entirely removed from the second region R2, as illustrated by a reference numeral 17B.

The mask pattern 18 may then be removed. After the mask pattern 18 is removed, a stack of the oxidation-type interface layer 14, the high-k layer 16, and the dielectric capping layer 17B may remain in the first region R1. In the second region R2, a stack of the channel layer 13, the oxidation-type interface layer 14, and the high-k layer 16 may remain.

Figure 2F:
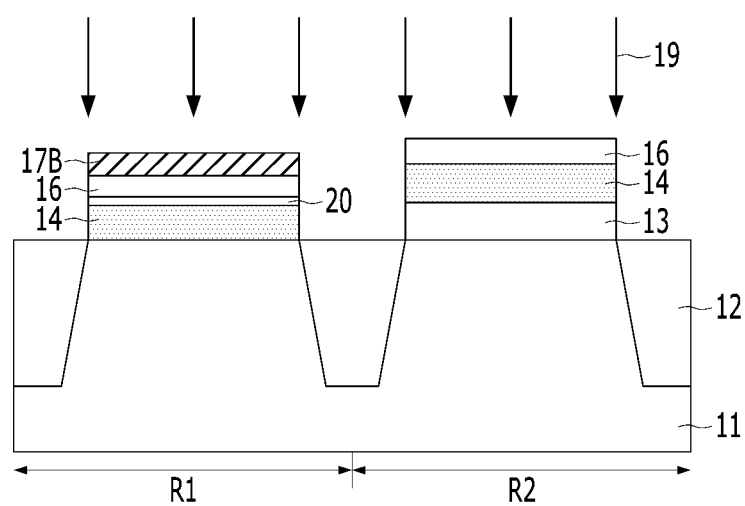

Referring to FIG. 2F, a post thermal treatment 19 may be performed. The post thermal treatment 19 may diffuse dipole-inducing species from the dielectric capping layer 17B. The dipole-inducing species may be diffused in the first region R1 and may be positioned between the oxidation-type interface layer 14 and the high-k layer 16 of the first region R1.

The post thermal treatment 19 may form a dipole interface 20 between the high-k layer 16 and the oxidation-type interface layer 14.

The post thermal treatment 19 may include plasma nitridation and annealing. Nitrogen may be implanted into the high-k layer 16 by the plasma nitridation and the annealing. For example, HfSiO as the high-k layer 16 may be reformed into HfSiON by the post thermal treatment 19.

As described above, the high-k layer 16 may be nitrified as soon as the dipole interface 20 is formed by the post thermal treatment 19. The dipole interface 20 may include diffused dipole-inducing species. The dipole interface 20 may include lanthanum. The dipole interface 20 may include lanthanum-diffused dipole interface.

Moreover, residual lanthanum of the dielectric capping layer 17B remaining undiffused may be diffused in the subsequent process, deteriorating the reliability of a transistor.

Figure 2G:
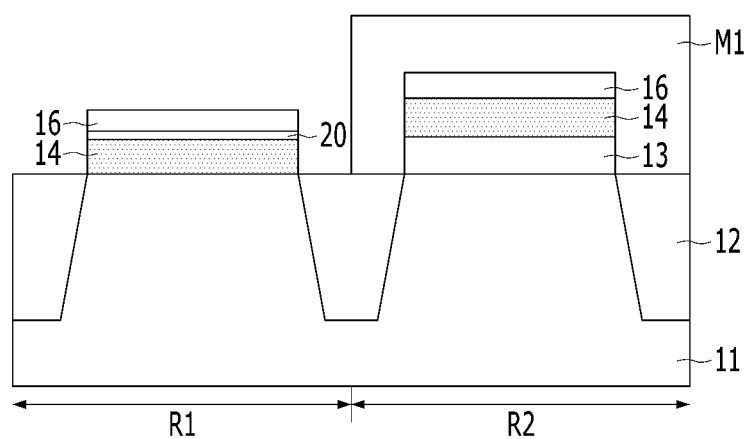

Therefore, as shown in FIG. 2G in accordance with the embodiment of the present invention, the dielectric capping layer 17B may be entirely removed from the first region R1 by using the mask pattern M1. The mask pattern M1 may include a photoresist pattern, and the mask pattern M1 may cover the first region R1. Hence, the dielectric capping layer 17B may be removed from both of the first region R1 and the second region R2.

A stack including the oxidation-type interface layer 14, the high-k layer 16, and the dipole interface 20 between the oxidation-type interface layer 14 and the high-k layer 16 may remain over the substrate 11 of the first region R1. A stack including the P channel layer 13, the oxidation-type interface layer 14, and the high-k layer 16 may remain over the substrate 11 of the second region R2.

Figure 2H:
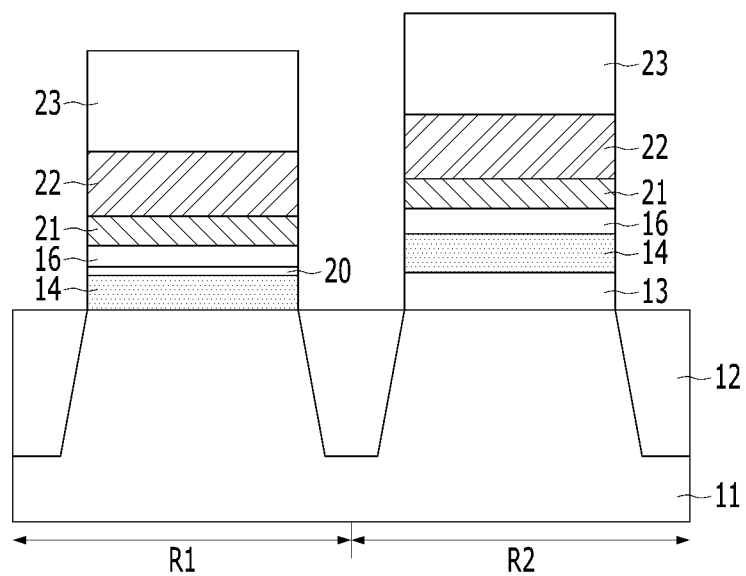

Referring to FIG. 2H, after removing the mask pattern M1, a gate conductive layer may be formed over the high-k layer 16. In the gate conductive layer, a metal-containing layer 21 and a low resistivity layer 22 may be sequentially formed. The metal containing layer 21 may be made of or include metal and metal nitride. In an embodiment, the metal-containing layer 21 may be titanium nitride, and the low resistivity layer 22 may be or include tungsten.

A hard mask layer 23 may be formed over the low resistivity layer 22. The hard mask layer 23 may be formed on the low resistivity layer 22. The hard mask layer 23 may be in direct contact with the low resistivity layer 22. The hard mask layer 23 may include silicon nitride.

Figure 2I:
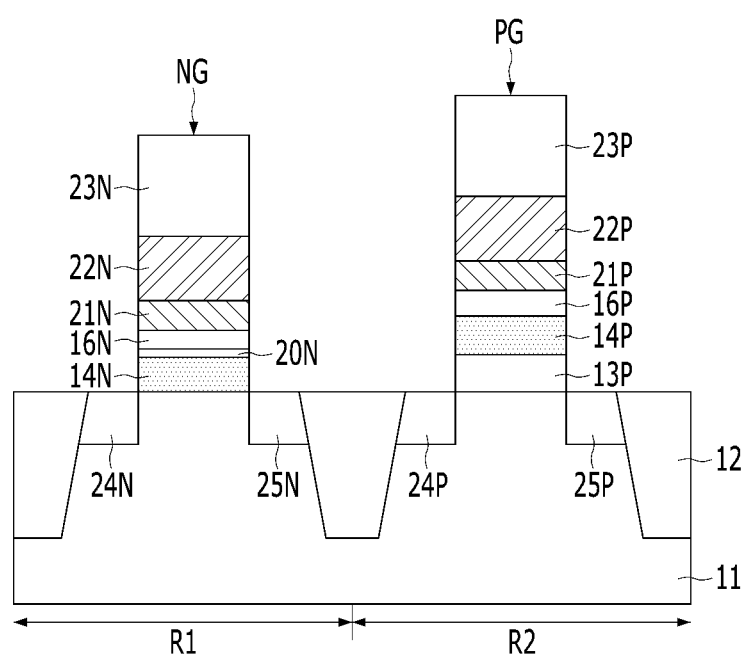

Referring to FIG. 2I, a gate patterning process may be performed. The hard mask layer 23, the low resistivity layer 22, the metal-containing layer 21, the high-k layer 16, the dipole interface 20, and the oxidation-type interface layer 14 may be sequentially etched by using a gate mask, which is not shown in the drawing. Accordingly, a first gate stack NG may be formed over the substrate 11 of the first region R1, and a second gate stack PG may be formed over the substrate 11 of the second region R2.

The first gate stack NG may include a first oxidation-type interface layer 14N, a first high-k layer 16N, a first metal electrode 21N, a first low resistivity electrode 22N, and a first hard mask layer 23N that are stacked in that order. The first gate stack NG may further include a dipole interface 20N between the first oxidation-type interface layer 14N and the high-k layer 16N. The dipole interface 20N may include dipole-inducing species.

The second gate stack PG may include a second oxidation-type interface layer 14P, a second high-k layer 16P, a second metal electrode 21P, a second low resistivity electrode 22P, and a second hard mask layer 23P that are stacked in that order. The second gate stack PG may not include the dipole interface 20N.

The first oxidation-type interface layer 14N and the second oxidation-type interface layer 14P may be made of the same material and may also have the same thickness. The first high-k layer 16N and the second high-k layer 16P may be made of the same material and may also have the same thickness. The first metal electrode 21N and the second metal electrode 21P may be made of the same material and may also have the same thickness.

Following the gate patterning process, processes known in the art to which the present invention pertains may be performed. For example, a process of forming source and drain regions (simply referred to as sources and drains) may be performed. The sources and drains may include first source/drain regions 24N/25N and second source/drain regions 24P/25P. The first source/drain regions 24N/25N may be formed in the first region R1. The first source/drain 24N/25N regions may include an N-type dopant. The second source/drain regions 24P/25P may be formed in the second region R2. The second source/drain regions 24P/25P may include a P-type dopant.

As described above, a first transistor may be formed by forming the first source/drain regions 24N/25N. The first transistor may include the first gate stack NG and the first source/drain regions 24N/25N. The first transistor may include an N-channel transistor including an NMOSFET.

A second transistor may be formed by forming the second source/drain regions 24P/25P. The second transistor may include the second gate stack PG and the first source/drain regions 24P/25P. The second transistor may include a P-channel transistor including a PMOSFET.

Figure 3:
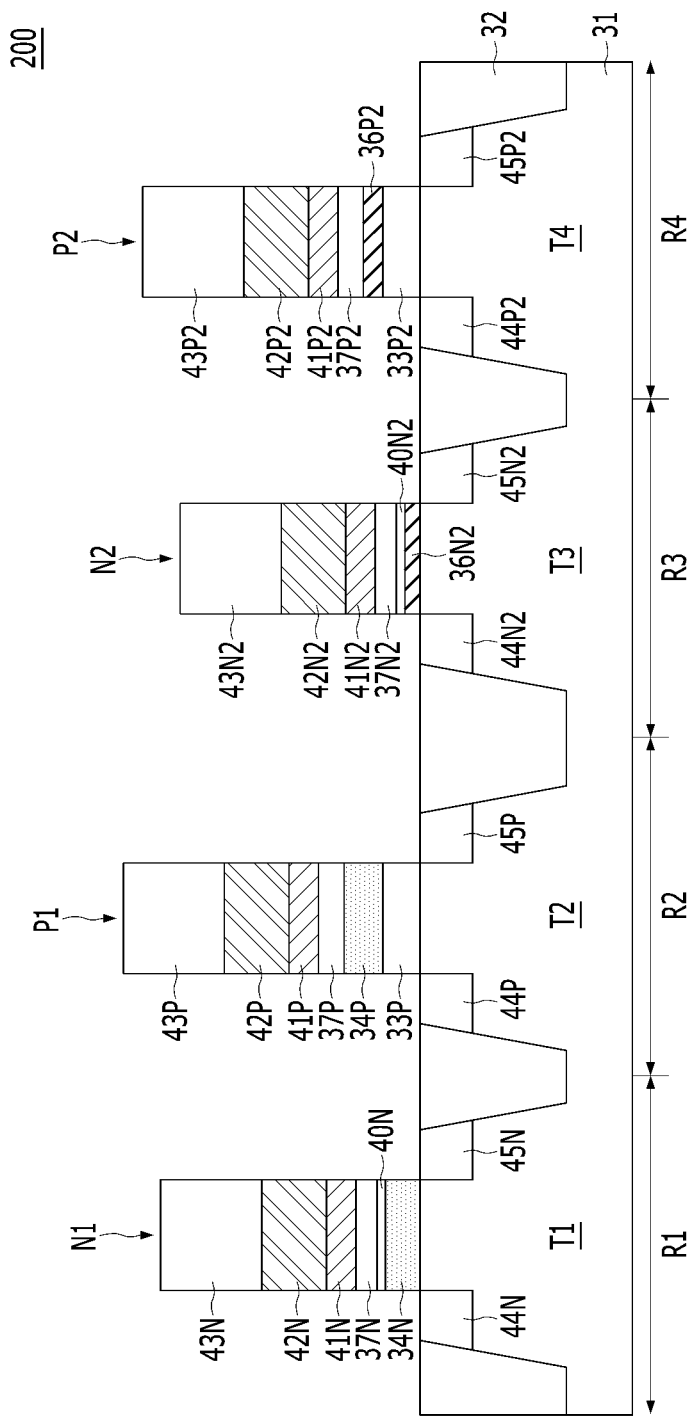
FIG. 3 is a cross-sectional view illustrating a semiconductor device in accordance with another embodiment of the present invention.

FIG. 3 is a cross-sectional view illustrating a semiconductor device in accordance with another embodiment of the present invention.

Referring to FIG. 3, the semiconductor device 200 may include a first transistor T1, a second transistor T2, a third transistor T3, and a fourth transistor T4. The first to fourth transistors T1 to T4 may be isolated by an isolation layer 32.

The semiconductor device 200 may include a first region R1, a second region R2, a third region R3, and a fourth region R4. Each of the first region R1, the second region R2, the third region R3, and the fourth region R4 may include a substrate 31, and the first region R1 and the second region R2, the third region R3, and the fourth region R4 may be isolated from each other by the isolation layer 32. The first region R1 may be a region where the first transistor T1 is formed, and the second region R2 may be a region where the second transistor T2 is formed. The third region R3 may be a region where the third transistor T3 is formed, and the fourth region R4 may be a region where the fourth transistor T4 is formed.

The first transistor T1 may include a first gate stack N1 formed over the substrate 31, and a first source region 44N and a first drain region 45N that are formed in the substrate 31 on both sides of the first gate stack N1. The first gate stack N1 may include a first interface layer 34N, a first high-k layer 37N, a first metal electrode 41N, a first low resistivity electrode 42N, and a first hard mask layer 43N that are stacked in that order. The first gate stack N1 may further include a dipole interface 40N between the first interface layer 34N and the first high-k layer 37N. The dipole interface 40N may include dipole-inducing species for modulating the threshold voltage of the first transistor T1. The threshold voltage of the first transistor T1 may be modulated by the dipole interface 40N. The dipole interface 40N may be made of or include a rare earth metal of the lanthanide series.

The second transistor T2 may include a second gate stack P1 formed over the substrate 31, and a second source region 44P and a second drain region 45P that are formed in the substrate 31 on both sides of the second gate stack P1. The second gate stack P1 may include a second interface layer 34P, a second high-k layer 37P, a second metal electrode 41P, a second low resistivity electrode 42P, and a second hard mask layer 43P that are stacked in that order. The second transistor T2 may further include a P channel layer 33P, and the P channel layer 33P may be formed over the substrate 31 below the second gate stack P1. The P channel layer 33P may be formed on the substrate 31 below the second gate stack P1. The P channel layer 33P may be in direct contact with the substrate 31 and the second gate stack P1. The P channel layer 33P may be crystalline and may contain a large amount of germanium. The P channel layer 33P may be made of or include silicon germanium. The second metal electrode 41P may have a work function suitable for the second transistor T2.

The third transistor T3 may include a third gate stack N2 formed over the substrate 31, and a third source region 44N2 and a third drain region 45N2 that are formed in the substrate 31 on both sides of the third gate stack N2. The third gate stack N2 may include a third interface layer 36N2, a third high-k layer 37N2, a third metal electrode 41N2, a third low resistivity electrode 42N2, and a third hard mask layer 43N2 that are stacked in the mentioned order. The third gate stack N2 may further include a dipole interface 40N2 between the third interface layer 36N2 and the third high-k layer 37N2. The dipole interface 40N2 may include dipole-inducing species for modulating the threshold voltage of the third transistor R1. The threshold voltage of the third transistor R1 may be modulated by the dipole interface 40N2. The dipole interface 40N2 may be made of or include a rare earth metal of the lanthanide series.

The fourth transistor T4 may include a fourth gate stack P2 formed over the substrate 31, and a fourth source region 44P2 and a fourth drain region 45P2 that are formed in the substrate 31 on both sides of the fourth gate stack P2. The fourth gate stack P2 may include a fourth interface layer 36P2, a fourth high-k layer 37P2, a fourth metal electrode 41P2, a fourth low resistivity electrode 42P2, and a fourth hard mask layer 43P2 that are stacked in that order. The fourth transistor T4 may further include a P channel layer 33P2, and the P channel layer 33P2 may be formed over the substrate 31 below the fourth gate stack P2. The P channel layer 33P2 may be formed on the substrate 31 below the fourth gate stack P2. The P channel layer 33P2 may be in direct contact with the substrate 31 and the fourth gate stack P2. The P channel layer 33P2 may be crystalline and may contain a large amount of germanium. The P channel layer 33P2 may be made of or include silicon germanium. The fourth metal electrode 41P2 may have a work function suitable for the second transistor R4.

The P channel layers 33P and 33P2 may be formed by a Selective Epitaxy Growth (SEG) process. The P channel layers 33P and 33P2 may have a thickness of approximately 100 Å s or less. The germanium concentration of the P channel layers 33P and 33P2 may range from approximately 20 at % to approximately 50 at %. The P channel layers 33P and 33P2 may be formed of silicon germanium only. The silicon capping layer may be omitted.

Referring to FIG. 3, the first gate stack N1 may include the first interface layer 34N, and the second gate stack 120P may include the second interface layer 34P. The third gate stack N2 may include the third interface layer 36N2, and the fourth gate stack P2 may include a fourth interface layer 36P2. The first interface layer 34N and the second interface layer 34P may be thicker than the third interface layer 36N2 and the fourth interface layer 36P2. The first interface layer 34N and the second interface layer 34P may be referred to as thick interface layers, and the third interface layer 36N2 and the fourth interface layer 36P2 may be referred to as thin interface layers.

The first interface layer 34N and the second interface layer 34P may be made of the same material. The first interface layer 34N and the second interface layer 34P may be made of silicon oxide. The first interface layer 34N and the second interface layer 34P may be made of silicon oxide provided by a combination of a deposition process and a post-oxidation process. For example, the first interface layer 34N and the second interface layer 34P may be an oxidation-type silicon oxide. The oxidation-type silicon oxide may be a material obtained by converting a deposition-type silicon oxide by a radical oxidation process. That is, the first interface layer 34N and the second interface layer 34P may be a converted silicon oxide which is provided by a combination of a deposition process and a post-oxidation process. The deposition-type silicon oxide may be deposited by an Atomic Layer Deposition (ALD) process or a Chemical Vapor deposition (CVD) process.

Since the deposition-type silicon oxide is converted into the oxidation-type silicon oxide, the first interface layer 34N and the second interface layer 34P may include high-quality $SiO_2$. The high-quality silicon oxide (HQ $SiO_2$) may not contain impurities. For example, a deposition-type silicon oxide may contain a large amount of impurities in the layer, but impurities may be removed as the deposition-type silicon oxide is converted by a radical oxidation process.

The third interface layer 36N2 and the fourth interface layer 36P2 may be made of the same material. The third interface layer 36N2 and the fourth interface layer 36P2 may be made of silicon oxide. The third interface layer 36N2 and the fourth interface layer 36P2 may be made of silicon oxide that is provided by an oxidation process. For example, each of the third interface layer 36N2 and the second interface layer 36P2 may be an oxidation-type silicon oxide. The third interface layer 36N2 may be formed by directly oxidizing the surface of the substrate 31. The second interface layer 36P2 may be formed by directly oxidizing the surface of the P channel layers 33P2.

As described above, the first interface layer 34N and the second interface layer 34P may be a converted silicon oxide by a combination of a deposition process and a post-oxidation process, and the third interface layer 36N2 and the fourth interface layer 36P2 may be an oxidation-type silicon oxide by a direct oxidation process. The converted silicon oxide may be thicker than the oxidation-type silicon oxide.

The first to fourth high-k layers 37N, 37P, 37N2 and 37P2 may include a high-k material having a high-k constant. The first to fourth high-k layers 37N, 37P, 37N2 and 37P2 may have a dielectric constant which is greater than that of $SiO_2$ which is approximately 3.9. Also, the first to fourth high-k layers 37N, 37P, 37N2 and 37P2 may be physically significantly thicker than $SiO_2$ and may have a lower equivalent oxide thickness (EOT) value. The first to fourth high-k layers 37N, 37P, 37N2 and 37P2 may have a dielectric constant which is greater than those of the first to fourth interface layers 34N, 34P, 36N2 and 36P2.

The first to fourth high-k layers 37N, 37P, 37N2 and 37P2 may include a metal-containing material, such as a metal oxide, a metal silicate, and a metal silicate nitride. The metal oxide may include an oxide containing a metal, such as hafnium (Hf), aluminum (Al), lanthanum (La), zirconium (Zr), or the like. The metal oxide may be made of or include hafnium oxide, aluminum oxide, lanthanum oxide, zirconium oxide, or a combination thereof. For example, the metal oxide may be made of or include $HfO_2$, $Al_2O_3$, $La_2O_3$, $ZrO_2$, or a combination thereof. The metal silicate may include a silicate containing a metal, such as hafnium (Hf) and zirconium (Zr). For example, the metal silicate may be made of or include hafnium silicate (HfSiO), zirconium silicate (ZrSiO), or a combination thereof. The metal silicate nitride may be made of or include hafnium silicate nitride (HfSiON), zirconium silicate nitride (ZrSiON), or a combination thereof.

The first to fourth metal electrodes 41N, 41P, 41N2 and 41P2 may be made of the same material. For example, the first to fourth metal electrodes 41N, 41P, 41N2 and 41P2 may include titanium nitride.

The first to fourth low resistivity electrodes 42N, 42P, 42N2 and 42P2 may be made of the same material. For example, the first to fourth low resistivity electrodes 42N, 42P, 42N2 and 42P2 may include a tungsten-based material.

According to another embodiment of the present invention, the first metal electrode 41N and the third metal electrode 41N2 may have a low work function, and the second and fourth metal electrodes 41P and 41P2 may have a high work function. Here, the low work function may refer to a work function that is lower than the mid-gap work function of silicon, and the high work function may refer to a work function that is higher than the mid-gap work function of silicon. The first metal electrode 41N and the third metal electrode 41N2 may include titanium-rich titanium nitride containing an excessive amount of titanium. The second and fourth metal electrodes 41P and 41P2 may include nitrogen-rich titanium nitride containing an excessive amount of nitrogen.

The first to fourth low resistivity electrodes 42N, 42P, 42N2 and 42P2 may be made of or include a low resistivity metal, for example, tungsten. The first to fourth low resistivity electrodes 42N, 42P, 42N2 and 42P2 may lower the resistances of the first to fourth gate stacks N1, P1, N2 and P2, respectively.

According to the above-described embodiment, the dipole interface 40N may be formed on the interface between the first interface layer 34N and the first high-k layer 37N. Thus, the threshold voltage of the first transistor T1 may be modulated.

In the third gate stack N2, a dipole interface 40N2 may be formed on the interface between the third interface layer 36N2 and the third high-k layer 37N2. As a result, the threshold voltage of the third transistor T3 may be modulated.

Since the P channel layer 33P is formed below the second gate stack P1, the threshold voltage of the second transistor T2 may be modulated. That is, since the P channel layer 33P contains a large amount of germanium, the energy band gap may be reduced, and accordingly, the threshold voltage of the second transistor T2 may be modulated into a level suitable for the second transistor T2.

Since the P channel layer 33P2 is formed below the fourth gate stack P2, the threshold voltage of the fourth transistor T4 may be modulated. That is, since the P channel layer 33P2 contains a large amount of germanium, the energy band gap may be reduced, and thus, the threshold voltage of the fourth transistor T4 may be modulated into a level suitable for the fourth transistor T4.

The first gate stack N1 and the third gate stack N2 may be a gate stack of NMOSFET, and they may be free of a $La_2O_3$ capping layer, in which a lanthanum oxide capping layer is omitted.

The first transistor T1 and the third transistor T3 may be N-channel transistors, and the second transistor T2 and the fourth transistor T4 may be P-channel transistors.

FIGS. 4A to 4K are cross-sectional views illustrating a method for fabricating a semiconductor device in accordance with another embodiment of the present invention.

Figure 4A:
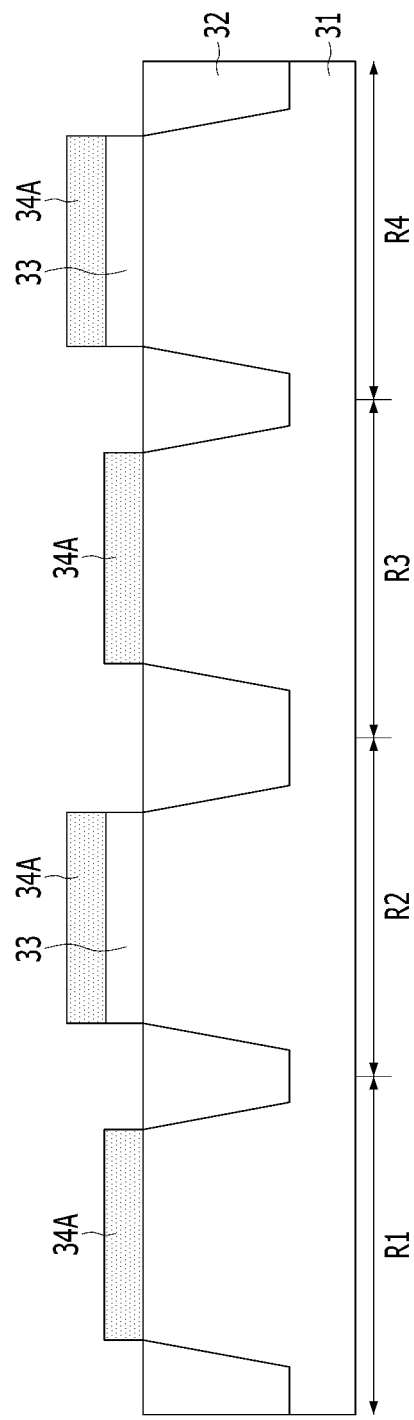

Referring to FIG. 4A, a substrate 31 may be prepared. The substrate 31 may include a plurality of regions in which transistors are formed. The regions may include first to fourth regions R1 to R4. The substrate 31 may be made of or include a semiconductor material. The substrate 31 may include a semiconductor substrate. The substrate 31 may include a silicon substrate, a silicon germanium substrate, or a Silicon-On-Isolator (SOI) substrate.

An isolation layer 32 may be formed in the substrate 31. The isolation layer 32 may be formed through a Shallow Trench Isolation (STI) process.

The first to fourth regions R1 to R4 may be isolated from each other by the isolation layer 32. The first region R1 and the third region R3 may be regions in which an NMOSFET is to be formed. The first region R1 may be a region where an NMOSFET having a thick gate dielectric layer is to be formed, and the third region R3 may be a region where an NMOSFET having a thin gate dielectric layer is to be formed. The second region R2 and the fourth region R4 may be regions where a PMOSFET is to be formed. The second region R2 may be a region in which a PMOSFET having a thick gate dielectric layer is to be formed, and the fourth region R4 may be a region in which a PMOSFET having a thin gate dielectric layer is to be formed. Although not shown, a well may be formed in the substrate 31 through a typical well forming process. P-type wells may be formed in the substrate 31 of the first region R1 and the third region R3, and N-type wells may be formed in the substrate 31 of the second region R2 and the fourth region R4.

Subsequently, a P channel layer 33 may be selectively formed over the substrate 31 of the second region R2 and the fourth region R4. The P channel layer 33 may be made of or include silicon germanium. The P channel layer 33 may be crystalline. The P channel layer 33 may be formed by a Selective Epitaxy Growth (SEG) process. The P channel layer 33 may have a thickness of 100 Å or less. The germanium concentration of the P channel layer 33 may range from approximately 20 at % to approximately 50 at %. The P channel layer 33 may be formed of silicon germanium only. The silicon capping layer may be omitted.

Subsequently, a deposition-type interface layer 34A may be formed. The deposition-type interface layer 34A may be formed on the surface of the substrate 31 in the first region R1 and the third region R3. The deposition-type interface layer 34A may be formed on the P channel layer 33 of the second region R2 and the fourth region R4. The deposition-type interface layer 34A may be made of or include an oxide or oxide-based material. The deposition-type interface layer 34A may be made of or include silicon oxide. The deposition-type interface layer 34A may be formed by an Atomic Layer Deposition (ALD) process or a Chemical Vapor Deposition (CVD) process. The deposition-type interface layer 34A may be formed to a thickness of approximately 10 Å or more. The deposition-type interface layer 34A may be formed to a thickness of approximately 10 Å to approximately 70 Å.

As described above, the deposition-type interface layer 34A may be formed by a deposition process rather than a thermal oxidation process. That is, the deposition-type interface layer 34A may include deposition-type oxide. The oxide formed by a thermal oxidation process may be simply referred to as an oxidation-type oxide.

The deposition-type oxide may be formed relatively thicker than a thermal oxide, but may include a large amount of impurities. Also, the deposition-type oxide may suppress excessive oxidation of the P channel layer 33.

The deposition-type interface layer 34A may be made of or include silicon oxide. The silicon oxide may be a deposition-type silicon oxide. For example, the silicon oxide may be formed using Chemical Vapor Deposition (CVD) or Atomic Layer Deposition (ALD).

Figure 4B:
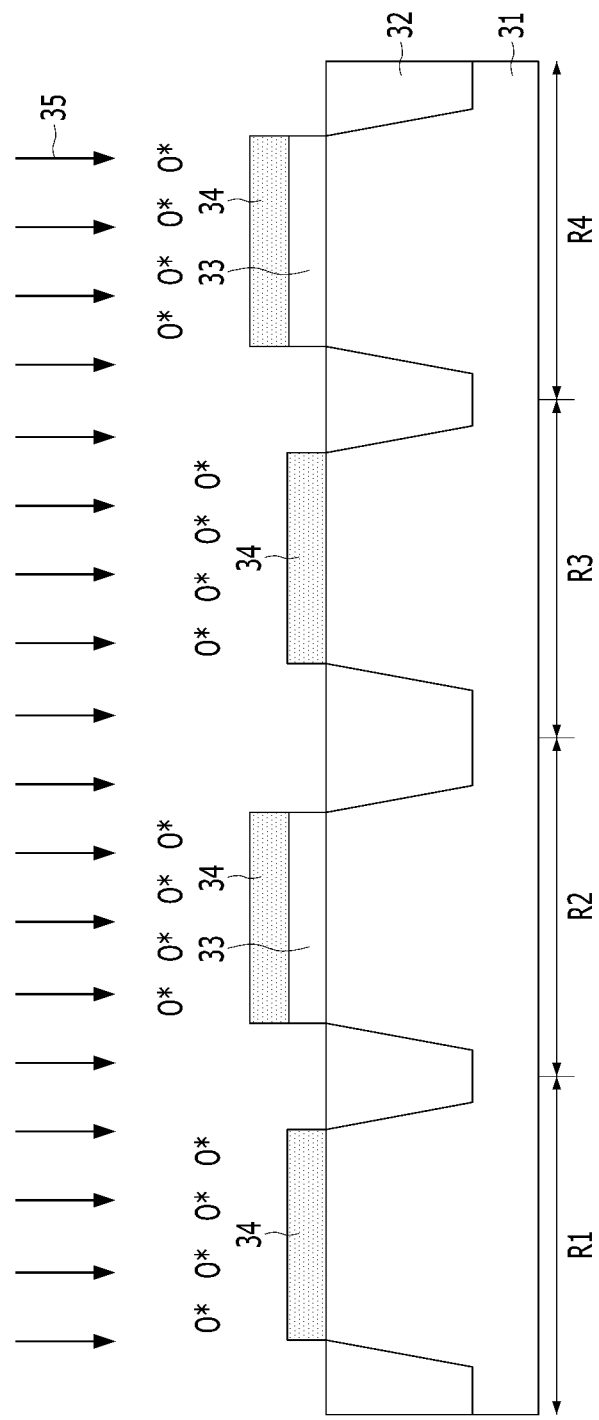

Referring to FIG. 4B, the post-process 35 may be performed. The post-process 35 may include a radical oxidation process. The radical oxidation process may be referred to as a post-oxidation process. The radical oxidation process may be performed using oxygen radicals (O*). The radical oxidation process may enhance the reliability of the deposition-type interface layer 34A. For example, impurities may be removed from the deposition-type interface layer 34A by a radical oxidation process. The impurities may be removed by oxygen radicals. Therefore, the deposition-type interface layer 34A may be converted into the oxidation-type interface layer 34 as shown by a reference numeral 34. Hereinafter, the oxidation-type interface layer 34 is simply referred to as a converted interface layer 34.

Since the converted interface layer 34 is free of impurities, it may have an excellent film quality with low defects. When the deposition-type interface layer 34A is silicon oxide, a high-quality silicon oxide (HQ $SiO_2$) may be formed by the radical oxidation process 35. The converted interface layer 34 may be a high-quality silicon oxide.

According to another embodiment of the present invention, the post-process 35 for forming the converted interface layer 34 may include a dry oxidation process. According to another embodiment of the present invention, after the converted interface layer 34 is formed, a plasma nitridation process and an annealing process may be performed.

The post-process 35 may remove impurities and defects from the converted interface layer 34, thereby enhancing reliability.

Figure 4C:
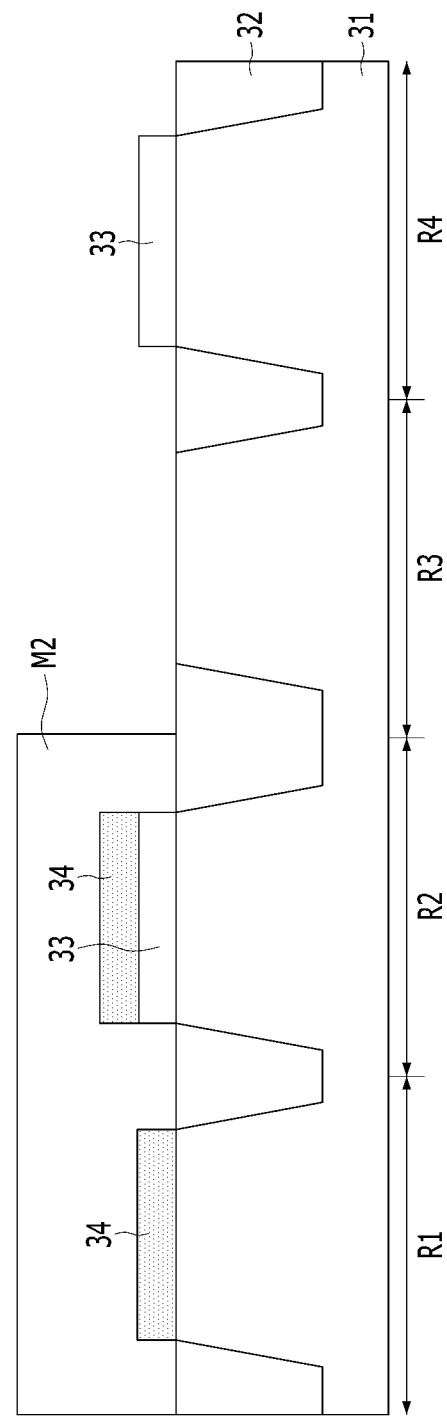

Referring to FIG. 4C, the converted interface layer 34 may be removed from the third region R3 and the fourth region R4 by using a mask pattern M2. The mask pattern M2 may include a photoresist pattern, and the mask pattern M2 may cover the first region R1 and the second region R2.

As the converted interface layer 34 is removed from the third and the fourth regions R3, R4, the surface of the substrate 31 of the third region R3 and the surface of the P channel layer 33 of the fourth region R4 may be exposed. The converted interface layer 34 may remain in the first and the second regions R1, R2.

Figure 4D:
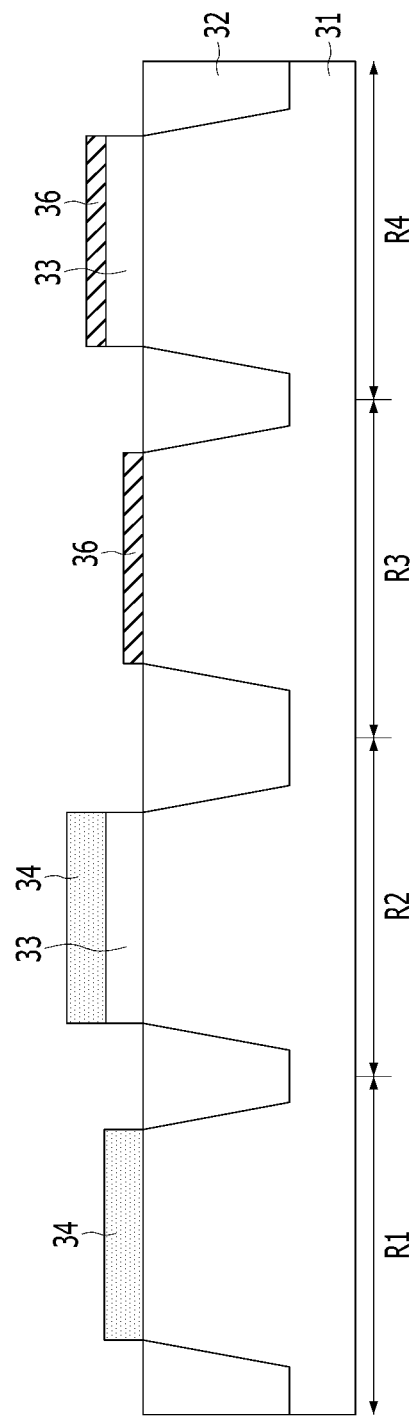

Referring to FIG. 4D, after removing the mask pattern M2, an oxidation-type interface layer 36 may be formed. The oxidation-type interface layer 36 may be formed by directly oxidizing the exposed surface of the substrate 31 in the third region R3 and the exposed surface of the P channel layer 33 in the fourth region R4. The oxidation-type interface layer 36 may be formed by a thermal oxidation process performed in an oxygen atmosphere. The oxidation-type interface layer 36 may be thinner than the converted interface layer 34. The oxidation-type interface layer 36 may have a thickness of approximately 10 Å or less. The converted interface layer 34 may be referred to as a 'thick oxidation-type interface layer', and the oxidation-type interface layer 36 may be referred to as a 'thin oxidation-type interface layer'. The terms 'thick oxidation-type interface layer' and 'thin oxidation-type interface layer' are used herein as relative terms comparing the thicknesses of the converted interface layer 34 and the oxidation-type interface layer 36. Hence, the oxidation-type interface layer 36 is a 'thin oxidation-type interface layer' relative to the converted interface layer 34.

As described above, the converted interface layer 34 may be formed in the first region R1 and the second region R2, and the oxidation-type interface layer 36 may be formed in the third region R3 and the fourth region R4. The oxidation-type interface layer 36 is not formed over the converted interface layer 34 or the isolation layer 32 because of the materials from which the layers are made.

Figure 4E:
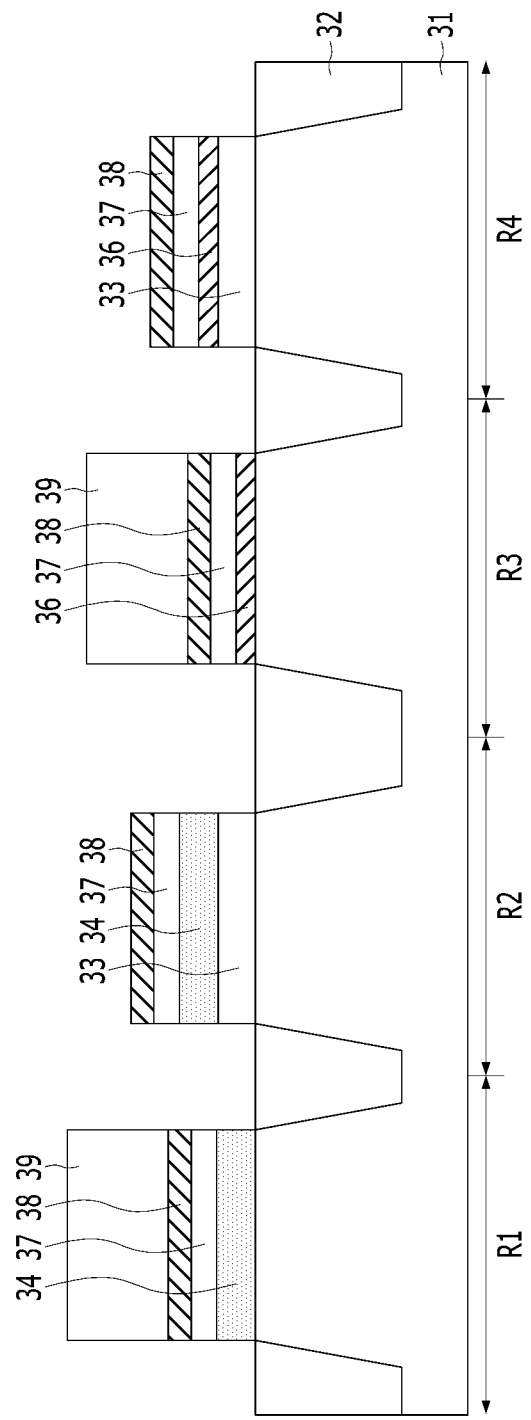

Referring to FIG. 4E, a high-k layer 37 may be formed over the converted interface layer 34 and the oxidation-type interface layer 36. The high-k layer 37 may be formed on the converted interface layer 34 and the oxidation-type interface layer 36. The high-k layer 37 may be in direct contact with the converted interface layer 34 and the oxidation-type interface layer 36. The high-k layer 37 may have a high dielectric constant (High-k), i.e., a dielectric constant which is greater than that of silicon oxide ($SiO_2$) which is approximately 3.9. Also, the high-k layer 37 may be physically thicker than silicon oxide ($SiO_2$) and may have a lower equivalent oxide thickness (EOT) value. The high-k layer 37 may have a higher dielectric constant than the oxidation-type interface layer 14. The high-k layer 37 may be made of or include a metal oxide, a metal silicate, a metal silicate nitride, or the like. The metal oxide may include an oxide containing a metal, such as hafnium (Hf), aluminum (Al), lanthanum (La), zirconium (Zr), and the like. The metal oxide may be made of or include hafnium oxide, aluminum oxide, lanthanum oxide, zirconium oxide, or a combination thereof. For example, the metal oxide may be made of or include $HfO_2$, $Al_2O_3$, $La_2O_3$, $ZrO_2$ or a combination thereof. The metal silicate may include a silicate containing metal, such as hafnium (Hf) and zirconium (Zr). For example, the metal silicate may be made of or include hafnium silicate (HfSiO), zirconium silicate (ZrSiO), or a combination thereof. The metal silicate nitride may be made of or include hafnium silicate nitride (HfSiON), zirconium silicate nitride (ZrSiON) or a combination thereof. According to this embodiment of the present invention, the high-k layer 37 may include HfSiO, which may be formed by an Atomic Layer Deposition (ALD) process.

A dielectric capping layer 38 may be formed over the high-k layer 37. The dielectric capping layer 38 may be formed on the high-k layer 37. The dielectric capping layer 38 may be in direct contact with the high-k layer 37. The dielectric capping layer 38 may contain dipole-inducing species. The dipole-inducing species may be diffused into the interface between the high-k layer 37 and the converted interface layer 34 in the subsequent process. The dipole-inducing species may be diffused into the interface between the high-k layer 37 and the oxidation-type interface layer 36 in the subsequent process. The dielectric capping layer 38 may include lanthanum. The dielectric capping layer 38 may include lanthanum oxide ($La_2O_3$). The dielectric capping layer 38 may be formed by an Atomic Layer Deposition (ALD) process or a Physical Vapor Deposition (PVD) process.

Subsequently, a mask pattern 39 may be formed. The mask pattern 39 may include a photoresist. The mask pattern 39 may be formed in the first and the third regions R1, R3 only. The second and the fourth regions R2, R4 may be exposed by the mask pattern 39. The mask pattern 39 may expose the dielectric capping layer 38 of the second and the fourth regions R2, R4. The mask pattern 39 may be formed on the dielectric capping layer 38 of the first and the third regions R1, R3. The mask pattern 39 may be in direct contact with the dielectric capping layer 38 of the first and the third regions R1, R3.

Referring to FIG. 4F, a portion of the dielectric capping layer 38 may be removed by using the mask pattern 39. The dielectric capping layer 38 may be removed from the second region R2 and the fourth region R4. For example, the dielectric capping layer 38 may be removed by using HCl. The dielectric capping layer 38 may remain in the first region R1 and the third region R3, while the dielectric capping layer 38 is entirely removed from both of the second region R2 and the fourth region R4.

The mask pattern 39 may then be removed. After the mask pattern 39 is removed, a stack of the converted interface layer 34, the high-k layer 37, and the dielectric capping layer 38 may remain in the first region R1. After the mask pattern 39 is removed, a stack of the oxidation-type interface layer 36, the high-k layer 37, and the dielectric capping layer 38 may remain in the third region R3. In the second region R2, a stack of the P channel layer 33, the converted interface layer 34, and the high-k layer 37 may remain. In the fourth region R4, a stack of the P channel layer 33, the oxidation-type interface layer 36, and the high-k layer 37 may remain.

Figure 4G:
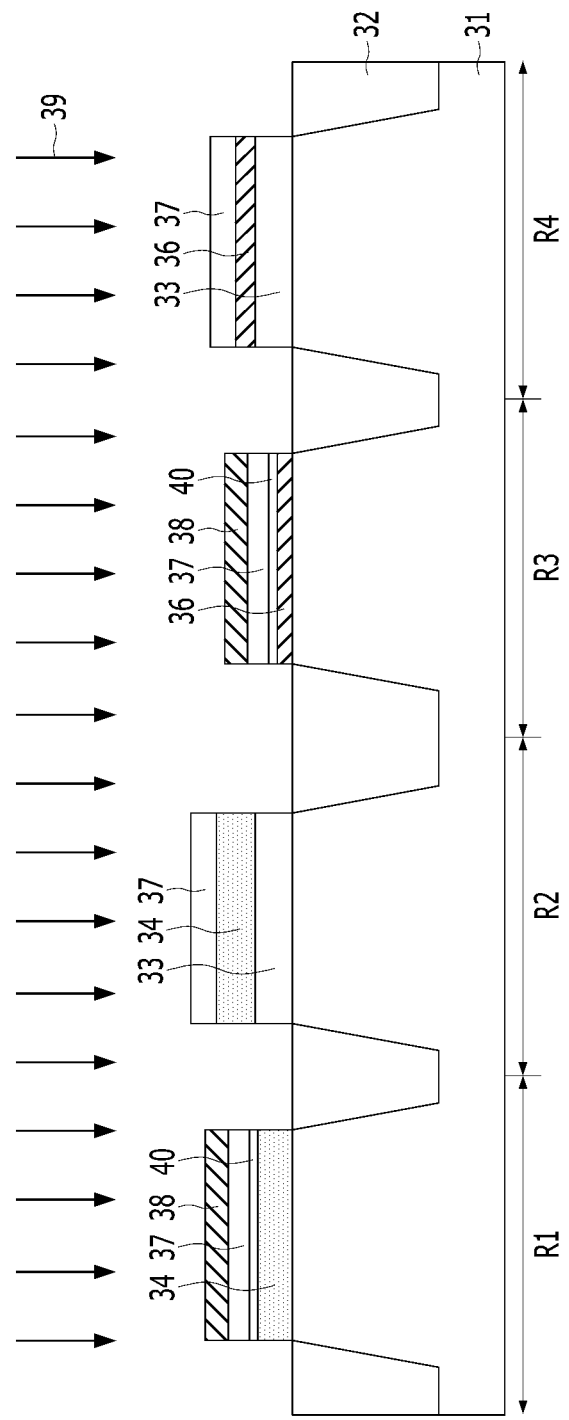

Referring to FIG. 4G, a post thermal treatment 39 may be performed. The post thermal treatment 39 may allow the dipole-inducing species to be diffused from the dielectric capping layer 38. The dipole-inducing species may be diffused in the first region R1 and the third region R3. The dipole-inducing species may be positioned on the interface between the high-k layer 37 and the converted interface layer 34 of the first region R1. As a result, a dipole interface 40 may be formed on the interface between the high-k layer 37 and the converted interface layer 34 of the first region R1 by the post thermal treatment 39. The dipole-inducing species may be positioned on the interface between the high-k layer 37 and the oxidation-type interface layer 36 of the third region R3. As a result, the dipole interface 40 may be formed on the interface between the high-k layer 37 and the oxidation-type interface layer 36 of the third region R3 by the post thermal treatment 39. The dipole interface 40 may include diffused dipole-inducing species. The dipole interface 40 may include lanthanum. The dipole interface 40 may include lanthanum-diffused dipole interface.

The post thermal treatment 39 may include a plasma nitridation process and an annealing process. Nitrogen may be implanted into the high-k layer 37 by the plasma nitridation process and the annealing process. For example, HfSiO as the high-k layer 16 may be reformed into HfSiON by the post thermal treatment 19.

As described above, the high-k layer 37 may be nitrified as soon as the dipole interface 40 is formed by the post thermal treatment 39.

Moreover, residual lanthanum of the dielectric capping layer 38 remaining undiffused may be diffused in the subsequent process which deteriorates the reliability of a transistor.

Figure 4H:
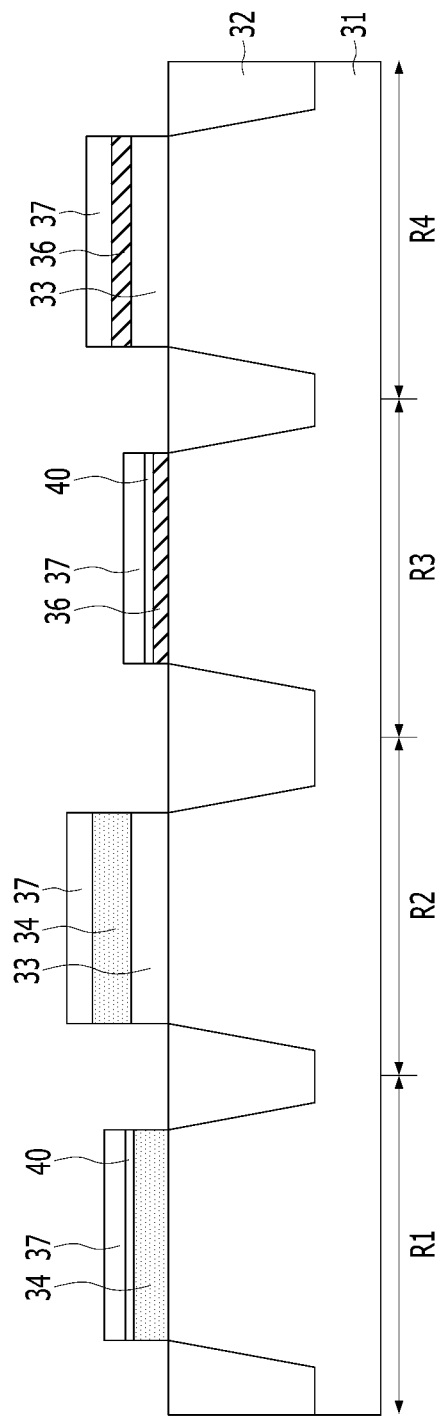

According to an embodiment of the present invention, as shown in FIG. 4H, the dielectric capping layer 38 may be removed from both of the first region R1 and the third region R3. The dielectric capping layer 38 may be removed from all of the first to fourth regions R1 to R4.

A stack of the converted interface layer 34 and the high-k layer 37 may remain over the substrate 31 of the first region R1, and the dipole interface 40 may be formed on the interface between the converted interface layer 34 and the high-k layer 37. A stack of the P channel layer 33, the converted interface layer 34, and the high-k layer 37 may remain over the substrate 31 of the second region R2. A stack of the oxidation-type interface layer 36 and the high-k layer 37 may remain over the substrate 31 of the third region R3, and the dipole interface 40 may be formed on the interface between the oxidation-type interface layer 36 and the high-k layer 37. A stack of the P channel layer 33, the oxidation-type interface layer 36, and the high-k layer 37 may remain over the substrate 31 of the fourth region R4.

Figure 4I:
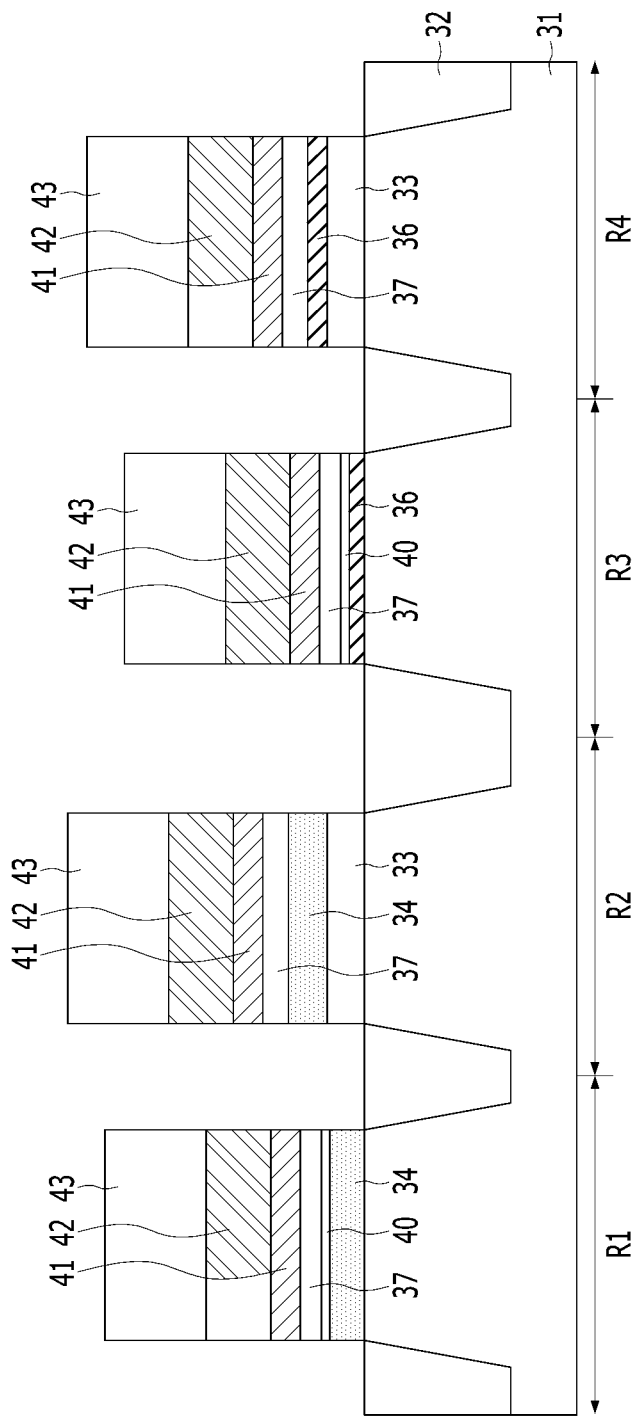

Referring to FIG. 4I, a gate conductive layer may be formed over the high-k layer 37 of each region. The gate conductive layer may be formed on the high-k layer 37 of each region and may directly contact the high-k layer 37 of each region. In the gate conductive layer, a metal-containing layer 41 and a low resistivity layer 42 may be sequentially formed. The metal-containing layer 41 may be made of or include metal and metal nitride. The metal-containing layer 41 may be titanium nitride, and the low resistivity layer 42 may include tungsten.

A hard mask layer 43 may be formed over the low resistivity layer 42. The hard mask layer 43 may be formed on the low resistivity layer 42. The hard mask layer 43 may directly contact the low resistivity layer 42. The hard mask layer 43 may be made of or include silicon nitride.

Figure 4J:
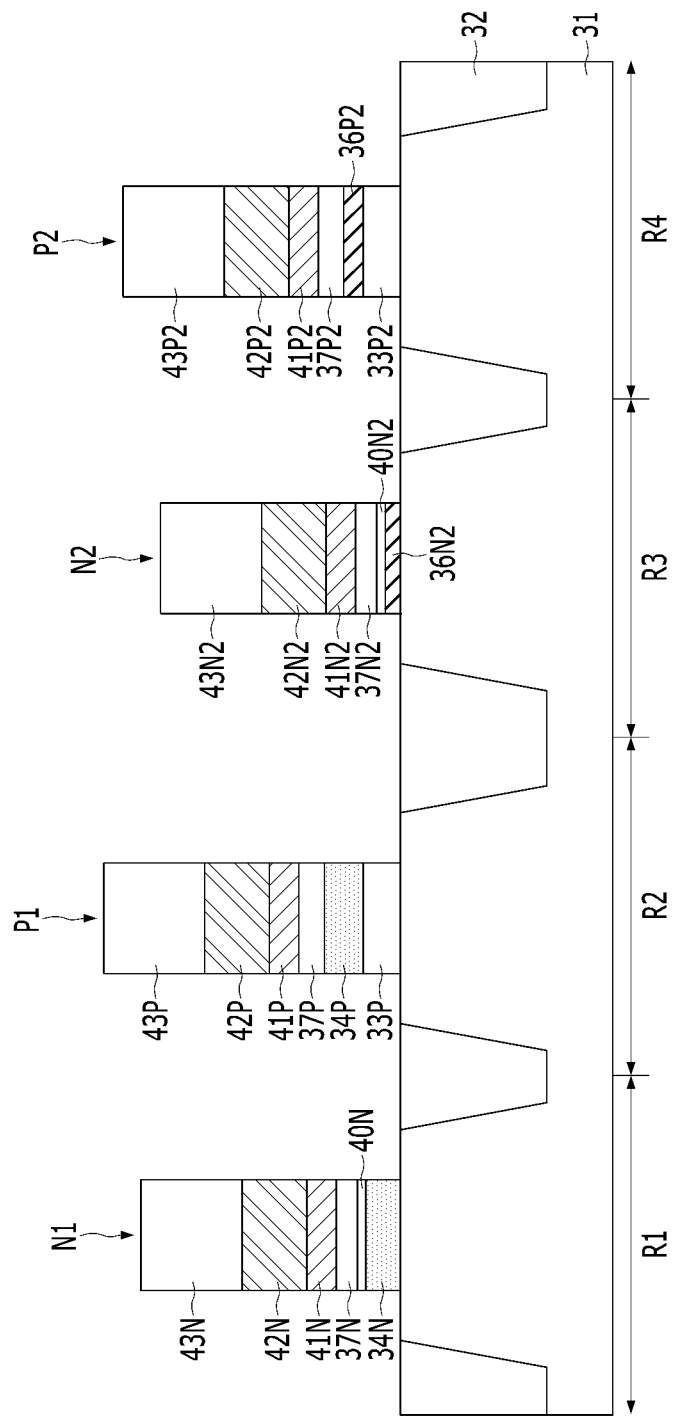
Figure 4K:
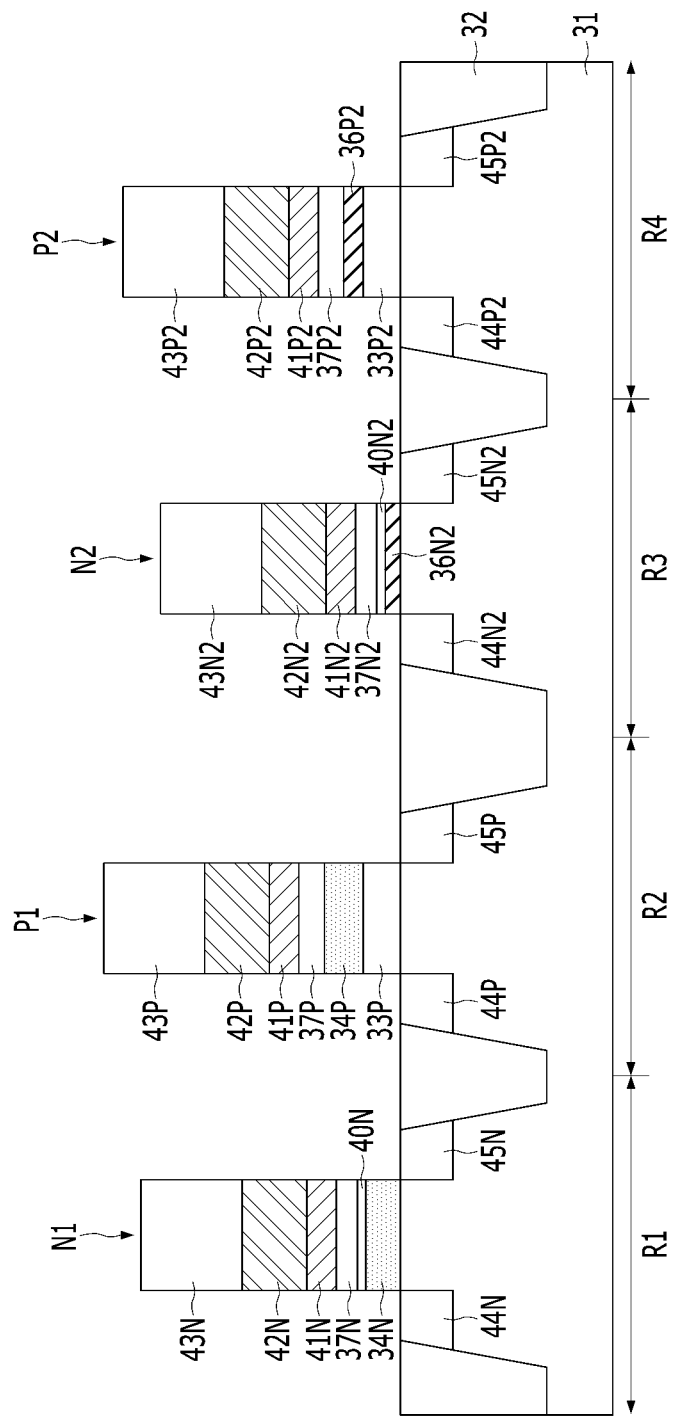

Referring to FIG. 4J, a gate patterning process may be performed. Gate stacks N1, P1, N2 and P2 may be formed in the regions R1 to R4 by using a gate mask, which is not shown.

A first gate stack N1 may be formed in the first region R1, and a second gate stack P1 may be formed in the second region R2. A third gate stack N2 may be formed in the third region R3, and a fourth gate stack P2 may be formed in the fourth region R4.

The first gate stack N1 may be formed by sequentially etching the hard mask layer 43, the low resistivity layer 42, the metal-containing layer 41, the high-k layer 37, the dipole interface 40, and the converted interface layer 34 in the first region R1. The first gate stack N1 may include a first converted interface layer 34N, a first high-k layer 37N, a first metal electrode 41N, a first low resistivity electrode 42N, and a first hard mask layer 43N that are stacked in that order. The first gate stack N1 may further include a dipole interface 40N between the first converted interface layer 34N and the first high-k layer 37N. The dipole interface 40N may include dipole-inducing species.

The second gate stack P1 may be formed by sequentially etching the hard mask layer 43, the low resistivity layer 42, the metal-containing layer 41, the high-k layer 37, and the converted interface 34, and the P channel layer 33 in the second region R2. The second gate stack P1 may include a P channel layer 33P, a second converted interface layer 34P, a second high-k layer 37P, a second metal electrode 41P, and a second low resistivity electrode 42P, and a second hard mask layer 43P.

The third gate stack N2 may be formed by sequentially etching the hard mask layer 43, the low resistivity layer 42, the metal-containing layer 41, the high-k layer 37, the dipole interface 40, and the oxidation-type interface layer 36 in the third region R3. The third gate stack N2 may include a first oxidation-type interface layer 36N2, a third high-k layer 37N2, a third metal electrode 41N2, a third low resistivity electrode 42N2, and a third hard mask layer 43N2 that are stacked in that order. The third gate stack N2 may further include a dipole interface 40N2 between the first oxidation-type interface layer 36N2 and the third high-k layer 37N2. The dipole interface 40N2 may include dipole-inducing species.

The fourth gate stack P2 may be formed by sequentially etching the hard mask layer 43, the low resistivity layer 42, the metal-containing layer 41, the high-k layer 37, the oxidation-type interface 36, and the P channel layer 33 in the fourth region R4. The fourth gate stack P2 may include the second oxidation-type interface layer 36P2, the fourth high-k layer 37P2, the fourth metal electrode 41P2, the fourth low resistivity electrode 42P2, and the fourth hard mask layer 43P2 that are stacked in that order.

As described above, the first gate stack N1 and the third gate stack N2 may include dipole interfaces 40N and 40N2, respectively, and the second gate stack P1 and the fourth gate stack P2 may not include the dipole interfaces 40N and 40N2.

The first gate stack N1 and the second gate stack P1 may include a first converted interface layer 34N and a second converted interface layer 34P, respectively. The third gate stack N2 and the fourth gate stack P2 may include a first oxidation-type interface layer 36N2 and a second oxidation-type interface layer 36P2, respectively.

The first converted interface layer 34N and the second converted interface layer 34P may be made of the same material and may have the same thickness. The first oxidation-type interface layer 36N2 and the second oxidation-type interface layer 36P2 may be made of the same material and may have the same thickness. The first converted interface layer 34N and the second converted interface layer 34P may be thicker than the first oxidation-type interface layer 36N2 and the second oxidation-type interface layer 36P2. The first converted interface layer 34N and the second converted interface layer 34P may have a first thickness. The first oxidation-type interface layer 36N2 and the second oxidation-type interface layer 36P2 may have a second thickness, and the first thickness may be greater than the second thickness. The first converted interface layer 34N and the second converted interface layer 34P may be formed of a material that is different from the material of the first oxidation-type interface layer 36N2 and the second oxidation-type interface layer 36P2. The first converted interface layer 34N and the second converted interface layer 34P may have a higher quality than the first oxidation-type interface layer 36N2 and the second oxidation-type interface layer 36P2. By higher quality it is meant having fewer impurities or defects.

The first to fourth high-k layers 37N, 37P, 37N2 and 37P2 may be made of the same material and may have the same thickness. The first to fourth metal electrodes 41N, 41P, 41N2 and 41P2 may be made of the same material and may have the same thickness. The first to fourth low resistivity electrodes 42N, 42P, 42N2 and 42P2 may be made of the same material and may have the same thickness. The first to fourth hard mask layers 43N, 43P, 43N2 and 43P2 may be made of the same material and may have the same thickness.

Following the gate patterning process, processes known in the art to which the present invention pertains may be performed. For example, a process for forming source/drain regions or the like may be performed. First source/drain regions 44N/45N may be formed in the first region R1, and second source/drain regions 44P/45P may be formed in the second region R2. Third source/drain regions 44N2/45N2 may be formed in the third region R3, and fourth source/drain regions 44P2/45P2 may be formed in the fourth region R4.

In an embodiment, the first source/drain 44N/45N and the third source/drain regions 44N2/45N2 may include an N-type dopant, and the second source/drain regions 44P/45P and the fourth source/drain regions 44P2/45P2 may include a P-type dopant.

According to an embodiment of the present invention, a method for fabricating a semiconductor device may include preparing a substrate 31 including a first region R1 and a second region R2. The regions R1 and R2 may be defined by an isolation layer 32. Then a channel layer 33 may be formed over the substrate 31 of the second region R2. The channel layer 33 may be in direct contact with the topmost surface of the substrate 31 of the second region R2. The method may further include forming a deposition-type interface layer 34A over the substrate 31 of the first region R1 and the channel layer 33. The deposition-type interface layer 34A may be formed on the substrate 31 of the first region R1 and the channel layer 33, and may be in direct contact with the substrate 31 of the first region R1 and the channel layer 33. The method may further include converting the deposition-type interface layer 34A into an oxidation-type interface layer 34 and forming a high-k layer 37 over the oxidation-type interface layer 34. A dipole interface 40 may be formed on the interface between the high-k layer 37 of the first region R1 and the oxidation-type interface layer 34. The method may further include forming a conductive layer 41/42 over the high-k layer 37. The method may further include patterning the conductive layer, the high-k layer, the dipole interface, and the oxidation-type interface layer so as to form a first gate stack N1 over the substrate 31 of the first region R1, and patterning the conductive layer, the high-k layer, and the oxidation-type interface layer so as to form a second gate stack P1 over the substrate 31 of the second region R2.

According to an embodiment of the present invention, a method for fabricating a semiconductor device may include preparing a substrate 31 including first and second transistor regions ((which correspond to R1, R3), forming a thick deposition-type interface layer 34A over the substrate 31 of the first transistor region (R1), and converting the thick deposition-type interface layer 34A into a thick oxidation-type interface layer 34. The method may further include forming a thin oxidation-type interface layer 36 over the substrate 31 of the second transistor region (R3), and forming a high-k layer 37 over the thick oxidation-type interface layer 34 and the thin oxidation-type interface layer 36. A first dipole interface 40 may be formed on the interface between the high-k layer 37 and the thick oxidation-type interface layer 34 in the first transistor region R1. The method may further include forming gate conductive layers 41 and 42 over the high-k layer 37.

Although the above embodiments of the present invention describe a method for fabricating a CMOSFET, the concept and spirit of the present invention are not limited to the fabrication of a CMOSFET only but may be applied to all kinds of semiconductor devices in which an N-channel transistor and a P-channel transistor are formed. For example, the technology of the present invention may be applied to memory devices, such as DRAM, FeRAM, 3D NAND, PCRAM, SU-RAM and the like. The technology of the present invention may also be applied to CMOSFETs in peripheral circuits that require high-speed operation of a CMOS image sensor (CIS).

According to an embodiment of the present invention, the reliability of a gate dielectric layer may be improved by forming a high-quality interface layer by converting a deposited interface layer into an oxidized interface layer thus significantly reducing the impurities and defects of the gate dielectric layer.

Also, the reliability of a transistor may be improved by removing a dielectric capping layer after forming a dipole interface.

While the present invention has been described with respect to specific embodiments, it will be apparent to those skilled in the art that various changes and modifications may be made without departing from the spirit and scope of the invention as defined in the following claims.

What is claimed is:

1. A method for fabricating a semiconductor device, comprising:
   forming an interface layer over a substrate;
   performing a post-process on the interface layer to remove impurities in the interface layer;
   forming a high-k layer over the interface layer after the post-process;
   forming a dipole interface on an interface between the high-k layer and the interface layer;
   forming a conductive layer against the high-k layer; and
   patterning the conductive layer, the high-k layer, the dipole interface, and the interface layer to form a gate stack over the substrate.

2. The method of claim 1, wherein the forming of the interface layer over the substrate is performed by an Atomic Layer Deposition (ALD) process or a Chemical Vapor Deposition (CVD) process.

3. The method of claim 1, wherein the interface layer before the post-process includes a deposition-type silicon oxide.

4. The method of claim 1, wherein the post-process includes a radical oxidation process, a dry oxidation.

5. The method of claim 1, wherein the post-process includes a plasma nitridation and annealing.

6. The method of claim 1, wherein the interfacial layer before the post-process includes a deposition-type oxide, and the interfacial layer after the post-process includes an oxidation-type silicon oxide.

7. The method of claim 6, wherein the dipole interface includes lanthanum.

8. The method of claim 1, wherein the forming of the dipole interface on the interface between the high-k layer and the interface layer includes:
   forming a sacrificial layer containing dipole-inducing species over the high-k layer;
   exposing the sacrificial layer to a post-thermal treatment to diffuse the dipole-inducing species into the interface between the interface layer and the high-k layer; and
   removing the sacrificial layer.

9. The method of claim 8, wherein the sacrificial layer includes lanthanum oxide.

10. The method of claim 1, wherein the gate stack includes a gate stack of an NMOSFET.

11. A method for fabricating a semiconductor device, comprising:
    forming an interface layer over a substrate;
    performing a plasma nitridation and an annealing on the interface layer;
    forming a high-k layer over the interface layer after the plasma nitridation and the annealing;
    forming a dipole interface on an interface between the high-k layer and the interface layer;
    forming a conductive layer against the high-k layer; and
    patterning the conductive layer, the high-k layer, the dipole interface, and the interface layer to form a gate stack over the substrate.

12. The method of claim 11, wherein the forming of the interface layer over the substrate includes:

depositing a deposition-type interface layer over the substrate; and performing post-process on the deposition-type interface layer to form a high-quality interface layer.

13. The method of claim 12, wherein the depositing of the deposition-type interface layer over the substrate is performed by an Atomic Layer Deposition (ALD) process or a Chemical Vapor Deposition (CVD) process.

14. The method of claim 12, wherein the deposition-type interface layer includes a deposition-type silicon oxide, and wherein the high-quality interface layer includes an oxidation-type silicon oxide.

15. The method of claim 12, wherein the post-process includes a radical oxidation process or a dry oxidation.

16. The method of claim 11, wherein the dipole interface includes dipole-inducing species.

17. The method of claim 16, wherein the dipole-inducing species includes lanthanum.

18. The method of claim 11, wherein the forming of the dipole interface on the interface between the high-k layer and the interface layer includes:

forming a sacrificial layer containing dipole-inducing species over the high-k layer;

exposing the sacrificial layer to a post-thermal treatment to diffuse the dipole-inducing species into the interface between the interface layer and the high-k layer; and removing the sacrificial layer.

19. The method of claim 18, wherein the sacrificial layer includes lanthanum oxide.

20. The method of claim 11, wherein the gate stack includes a gate stack of an NMOSFET.

* * * * *

UNITED STATES PATENT AND TRADEMARK OFFICE
CERTIFICATE OF CORRECTION

| | | |
|---|---|---|
| PATENT NO. | : 11,705,336 B2 | Page 1 of 1 |
| APPLICATION NO. | : 17/682643 | |
| DATED | : July 18, 2023 | |
| INVENTOR(S) | : Yunhyuck Ji | |

It is certified that error appears in the above-identified patent and that said Letters Patent is hereby corrected as shown below:

On the Title Page

Please insert the following:
--(30) Foreign Application Priority Data
Oct. 31, 2019 (KR) ........................ 10-2019-0138050--

Signed and Sealed this
Ninth Day of April, 2024

Katherine Kelly Vidal
*Director of the United States Patent and Trademark Office*